(12) United States Patent
Hamada et al.

(10) Patent No.: US 6,493,863 B1
(45) Date of Patent: Dec. 10, 2002

(54) METHOD OF DESIGNING SEMICONDUCTOR INTEGRATED CIRCUIT

(75) Inventors: Masao Hamada, Fukuoka (JP);
Takashi Hashimoto, Fukuoka (JP);
Shun-ichi Kurohmaru, Fukuoka (JP);
Koji Kai, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 94 days.

(21) Appl. No.: 09/711,151

(22) Filed: Nov. 14, 2000

(30) Foreign Application Priority Data

Nov. 15, 1999 (JP) ............................................ 11-323587

(51) Int. Cl.$^7$ .............................................. G06F 17/50
(52) U.S. Cl. .................................. 716/18; 716/1; 716/3
(58) Field of Search ........................................ 716/1–21

(56) References Cited

U.S. PATENT DOCUMENTS

| | | | | |
|---|---|---|---|---|
| 5,706,205 | A | 1/1998 | Masuda et al. ............. | 364/489 |
| 5,764,951 | A | * 6/1998 | Ly et al. ..................... | 395/500 |
| 6,216,252 | B1 | * 4/2001 | Dangelo et al. ............... | 716/1 |
| 6,289,491 | B1 | * 9/2001 | Dupenloup .................... | 716/5 |
| 6,324,678 | B1 | * 11/2001 | Dangelo et al. .............. | 716/18 |

FOREIGN PATENT DOCUMENTS

JP 8-101861 4/1996

OTHER PUBLICATIONS

Horstmannshoff et al, "Optimized System Synthesis of Complex RT Level Building Blocks From Multirate Dataflow Graphs," IEEE, Nov. 1999, pp. 1–6.*
Mathur et al, "HDL Generation From Parameterized Schematic Design System," IEEE, 1997, pp. 130–135.*
John Willoughby, "Synthesis Support For Design Partitioning," IEEE, 1997, pp. 32–37.*

* cited by examiner

Primary Examiner—Vuthe Siek
(74) Attorney, Agent, or Firm—McDermott, Will & Emery

(57) ABSTRACT

After a program is inputted in the high-level synthesis of system design, blocks each for implementing at least one function and an HW resource connection graph showing a plurality of HW resources and a wiring structure connecting the HW resources are generated. From a database storing the HW resources, data on the size of each of the HW resources is inputted such that the HW resources are provisionally placed and a contribution rate of each of parameters which affect power consumption and the like in each of wires between blocks with respect to all the wires is calculated as a weight of signal lines between blocks. Block generation is performed repeatedly till the weight of signal lines between blocks in each of the wires between blocks becomes a threshold value or less. If the weight of signal lines between blocks becomes the threshold value or less, an HDL is outputted. By performing block generation in consideration of a reduction in power consumption and the like in the high-level synthesis on the high level design, overall design efficiency is increased.

24 Claims, 26 Drawing Sheets

Fig. 2(a) Numbers of Operations and Stages are Reduced Based on Division Rule and Exchange Rule
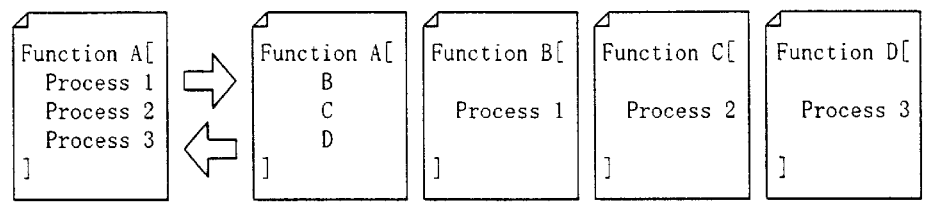
Fig. 2(b) Hierarchical/Non-Hierarchical Organization of Design Structures
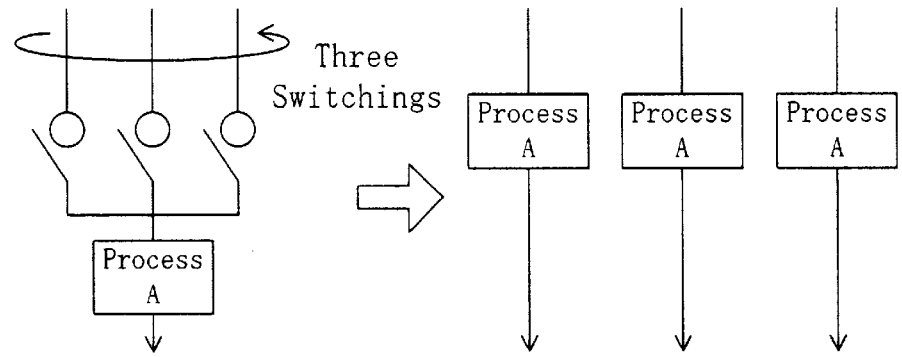
Fig. 2(c) Expansion of Loop
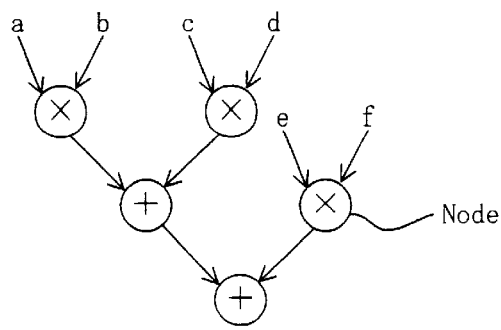
CDFG (Control Data Flow Graph) is Outputted as a Result of Transformation
Fig. 2(d)

1 iteration

```
task0(x0, x1, y0)
{
    function0(...)
    function1(...)
    ...
}
task1(y0, y1, z0)
{
    function0(...)
    function1(...)
    ...
}
task3(z0, z1, w0)
{
    function0(...)
    function1(...)
    ...
}
```

```
task2(a0, a1, z1)
{
    function0(...)
    function1(...)
    ...
}
```

Fig. 12(a)
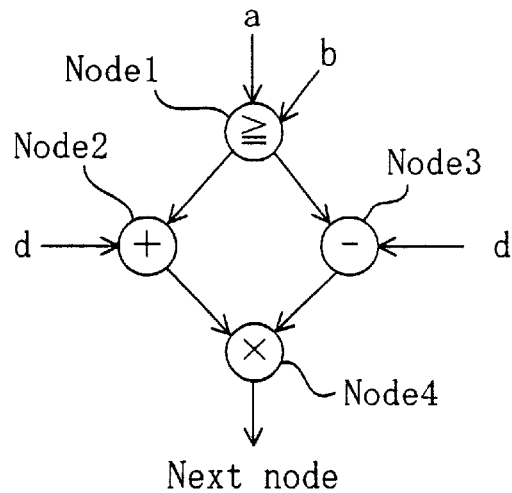
Fig. 12(b)
```
If(a≧b){
  c=a+d;
}
else{
  c=b-d;
}
y=c×x
```
Fig. 13
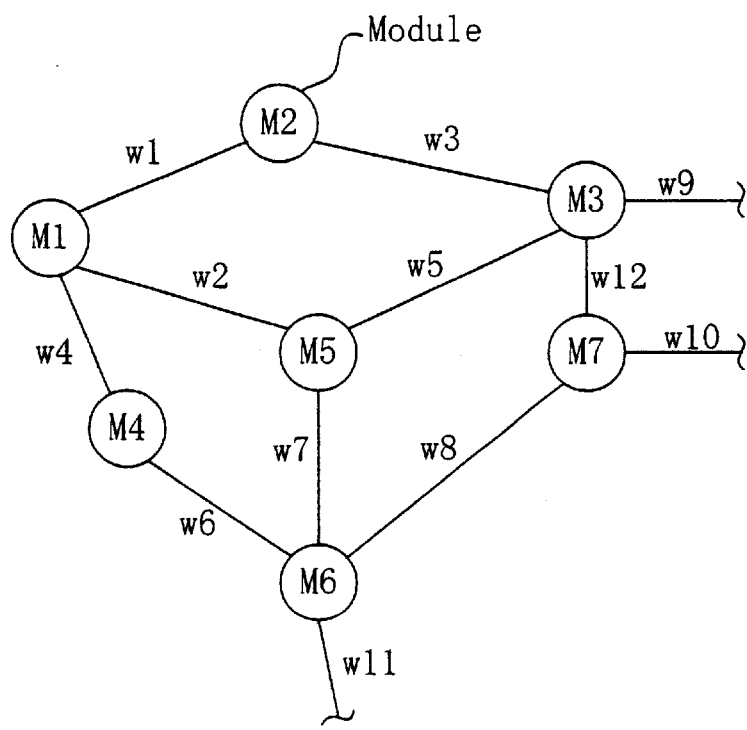

| Wire Length between Blocks | | α |
|---|---|---|
| between M and N | 100 | 10 |
| between L and M | 50 | 5 |
| between N and O | 10 | 1 |
| between K and L | 20 | 2 |

$L = \alpha \times Li$

Fig. 28 (a)

```
prog P{
  .
  A(z,2,x,y);
  .
}
```

```
function A(a,b,c,d){
  a=b*c+d;
}
```

```
prog Q{
  .
  A(t,3,r,s);
  .
}
```

Circuit Block Obtained by Hardwaring Prog P except for Function A

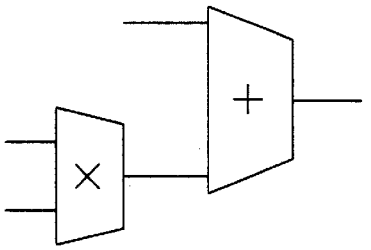

Operation Module Obtained by Hardwaring Function A

Circuit Block Obtained by Hardwaring Prog Q except for Function A

Fig. 28 (b)

```
prog P{
  .
  z=2*x+y;
  .
}
```

```
prog Q{
  .
  t=3*r+s;
  .
}
```

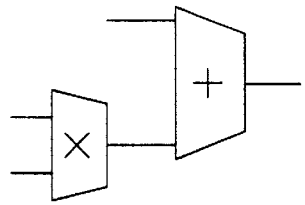

Circuit Block Obtained by Hardwaring Prog P Resulting from In-line Expansion of Function A

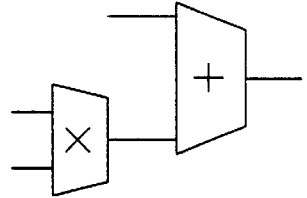

Circuit Block Obtained by Hardwaring Prog Q Resulting from In-line Expansion of Function A

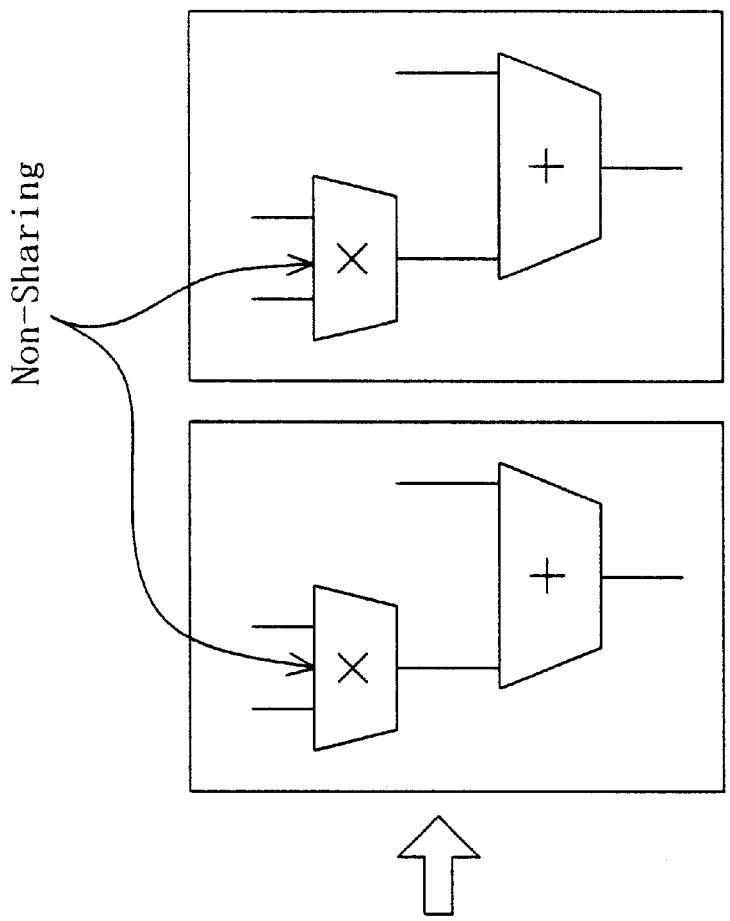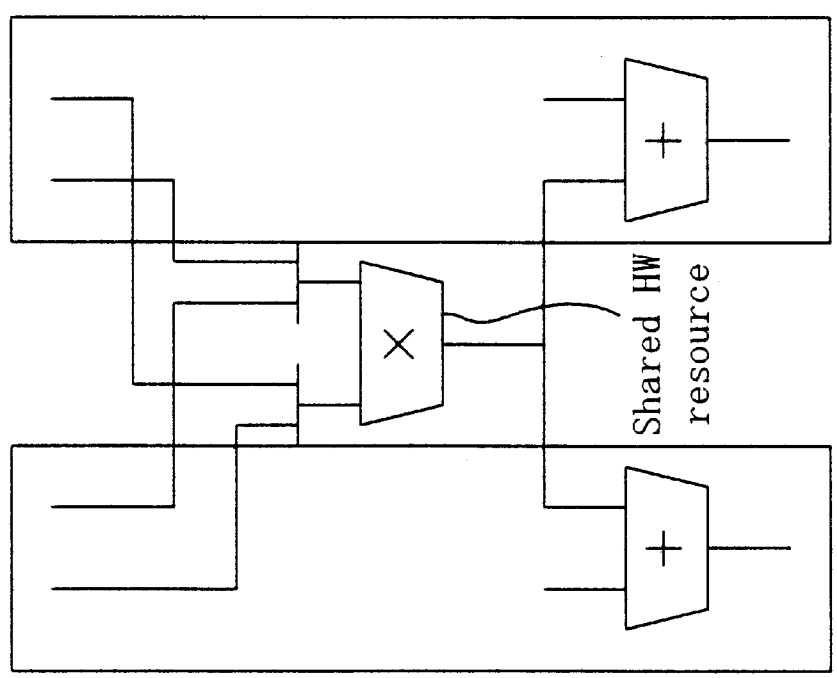

METHOD OF DESIGNING SEMICONDUCTOR INTEGRATED CIRCUIT

BACKGROUND OF THE INVENTION

The present invention relates to a method of designing a semiconductor integrated circuit device. More particularly, it relates to an approach to improving the efficiency of the overall design process, while reducing power consumption.

In the design of a semiconductor integrated circuit device, high-level synthesis has been performed conventionally by the process of gradually specifying, in a programming language, the individual components of the semiconductor integrated circuit device and the functions thereof in accordance with the specifications, behavior, RT, and the like of the semiconductor integrated circuit. After the high-level synthesis, logic synthesis is performed in accordance with design data described in an HDL to generate a logic circuit (net list) and then placement and routing is performed. At this stage, the specific circuit components and wires are becoming apparent so that an optimization process utilizing the estimation of power consumption, a processing speed, and the like effected by simulation is performed.

For example, the optimization process is performed in consideration of a tradeoff between the operating speed of a circuit and a chip area.

However, with the advent of a large-scale semiconductor integrated circuit device such as a system LSI in recent years, the degree of optimization after logic synthesis varies depending on the degree of properness with which the design has been performed in high-level synthesis preceding the logic synthesis. This is because, since block partitioning and the like have been performed almost definitely prior to the logic synthesis, the flexibility with which a change is permitted in the subsequent optimization process is low.

In the conventional design of a semiconductor integrated circuit device, however, whether or not high-level synthesis is proper depends on the skillfulness of the designer and means for optimization in the high-level synthesis remains undeveloped. This presents a serious obstacle to implementing more efficient design after logic synthesis.

SUMMARY OF THE INVENTION

It is therefore an object of the present invention to improve the efficiency of the overall design process by providing means for optimizing high-level synthesis and implement the design of a semiconductor integrated circuit device which is particularly low in power consumption. A method of designing a semiconductor integrated circuit device according to the present invention comprises the steps of: (a) inputting an application program including a behavioral description for designing the semiconductor integrated circuit device, partitioning, on a function-by-function basis, the application program including the behavioral description into blocks in which HW resources are to be placed, and generating an HW resource connection graph representing respective positions of the HW resources in each of the blocks and wires connecting the individual blocks; (b) inputting at least data on respective sizes of the HW resources from an HW library, provisionally placing the HW resources which are the HW resource connection graph, and outputting provisional placement data; (c) calculating, as weights of signal lines between blocks, ratios of a parameter between the individual wires connecting the blocks which affects at least either one of power consumption and each wire delay; (d) judging whether or not each of the weights of signal lines between blocks is equal to or less than a threshold value; and (e) outputting, when each of the weights of signal lines between blocks becomes equal to or less than the threshold value, an RTL logic circuit described in an HDL, the generation of the blocks in the step (a) and the steps (b) to (d) being repeatedly performed till each of the weights of signal lines between blocks is judged equal to or less than the threshold value in the step (d).

In accordance with the method, it becomes possible to perform effective block partitioning which allows optimization of a parameter affecting power consumption and delay to be judged quantitatively instead of block partitioning based on a description in an application program or on the experience of the designer. This allows placement and routing and the like to be performed by placing blocks resulting from rather proper partitioning on the low level design and thereby improves the efficiency of the overall design.

In the method of designing a semiconductor integrated circuit device, the step (a) includes the sub-steps of: (a1) partitioning the description in the application program into blocks representing tasks and generating a first data flow chart showing data flows between the individual tasks; (a2) simulating the application program; (a3) calculating, as first weight of signal lines between blocks, ratios between transition frequencies in the respective wires between blocks obtained in the sub-step (a2); (a4) judging whether or not each of the initial weights of signal lines between blocks is equal to or less than an initial threshold value; (a5) generating, when the initial weight of signal lines between blocks becomes equal to or less than the initial threshold value, a second data flow chart to allow the HW resources stored in the HW library to be placed in each of the blocks in the first data flow chart; and (a6) determining an execution timing for each of the blocks in the second data flow chart and placing the HW resources to generate the HW resource connection graph, block repartitioning in the sub-step (a1) and the sub-steps (a2) to (a4) being repeated till the initial weight of signal lines between block becomes equal to or less than the initial threshold value. As a consequence, block partitioning using characteristics inherent to the application is roughly optimized first and then fine block repartitioning using the provisional placement data is performed. This improves the efficiency of block partitioning performed in two stages.

In the method of designing a semiconductor integrated circuit device, the step (a) includes the sub-steps of: (a1) partitioning the description in the application program into modules each composed of a plurality of operational functions and generating a first data flow chart showing data flows between the individual modules; (a2) simulating the application program; (a3) calculating, as first weights of signal lines between modules, ratios of a parameter between respective wires connecting the modules obtained in the sub-step (a2) which affects at least either one of power consumption and each wire delay; (a4) grouping the plurality of modules into the plurality of blocks each composed of the plurality of modules; (a5) generating a second data flow chart which allows the HW resources stored in the HW library to be placed in each of the modules in the first data flow chart; and (a6) determining an execution timing for each of the modules in the second data flow chart and allocating the HW resources to generate the HW resource connection graph and the step (c) includes calculating second weights of signal lines between modules from the provisional placement data and the first weights of signal lines between modules and designating, as the weights of signal lines between blocks, the respective second weights of signal lines between modules of the wires connecting the blocks. As a consequence, modules as small circuit units composing the blocks are generated first and then the plurality of generated modules are combined to generate the blocks. This reduces constraints placed on block generation and module generation and allows optimum generation of the modules and blocks in accordance with the first CDFG.

In the method of designing a semiconductor integrated circuit device, the step (a) includes the sub-steps of: (a1) analyzing the description in the application program to generate a first data flow chart showing data flows between operational functions each implementing a behavior to allow the HW resources stored in the HW library to be placed; (a2) generating, from the plurality of operational functions, modules each composed of the plurality of operational functions and generating, from the first data flow chart, a second data flow chart showing data flows between the individual modules; (a3) simulating the application program; (a4) calculating, as first weights of signal lines between modules, ratios of a parameter between respective wires connecting the modules which affects at least either one of power consumption and each wire delay; (a5) grouping the plurality of modules into the plurality of blocks composed of the plurality of modules; and (a6) determining an execution timing for each of the modules in the second data flow chart and allocating the HW resources to generate the HW resource connection graph and the step (c) includes calculating second weights of signal lines between modules from the provisional data and the first weights of signal lines between modules and designating, as the weights of signal lines between blocks, the respective second weights of signal lines between modules of the wires connecting the blocks.

As a consequence, so-called transformation is performed prior to module generation. This adds optimization by the transformation to module generation.

In the method of designing a semiconductor integrated circuit device, the step (a) includes the sub-steps of: (a1) analyzing the behavioral description in the application program to generate a first data flow chart showing data flows between operational functions to allow the HW resources stored in the HW library to be placed; (a2) determining an execution timing for each of the operational functions in the first data flow chart and allocating the HW resources to generate the HW resource connection graph; (a3) generating, from the plurality of operational functions, modules each composed of the plurality of operational functions; (a4) simulating the application program; (a5) calculating, as first weights of signal lines between modules, ratios of a parameter between respective wires connecting the modules obtained in the sub-step (a3) which affects at least either one of power consumption and each wire delay; and (a6) grouping the plurality of modules into the plurality of blocks each composed of the plurality of modules and the step (c) includes calculating second weights of signal lines between modules from the provisional placement data and the first weights of signal lines between modules and designating, as the weights of signal lines between blocks, the second weights of signal lines between blocks. As a consequence, module generation and block generation are performed by using data obtained from so-called transformation and binding. This adds optimization by the transformation and binding to module generation.

The method of designing a semiconductor integrated circuit device further comprises, after the step (e), the steps of: (f) performing logic synthesis using design data described in the HDL to represent data on the blocks and a wiring structure between the blocks in a net list; and (g) performing placement and routing using the net list and outputting layout data, wherein the placement and routing is performed in the step (g) by using, as position determining data, the provisional placement data obtained in the step (b) and data on the blocks obtained in the step (c). This allows prompt placement and routing to be performed by placing blocks resulting from partitioning in high-level synthesis.

The method of designing a semiconductor integrated circuit device further comprises, after the step (e), the steps of: (f) performing logic synthesis using design data described in the HDL to represent data on the modules and a wiring structure between the modules in a net list; and (g) performing placement and routing using the net list and outputting layout data, wherein placement and routing is performed in the step (g) by using the provisional placement data obtained in the step (b) and data on the blocks obtained in the step (c) and after the step (e) and before the step (f), RTL simulation is performed and data resulting from the RTL simulation is feedbacked to the step (c). This allows more proper block partitioning to be performed based on data using the HDL data.

The method of designing a semiconductor integrated circuit device further comprises, after the step (e), the steps of: (f) performing logic synthesis using design data described in the HDL to represent data on the modules and a wiring structure between the modules in a net list; and (g) performing placement and routing using the net list and outputting layout data, wherein placement and routing is performed in the step (g) by using the provisional placement data obtained in the step (b) and data on the blocks obtained in the step (c) and after the step (f) and before the step (g), provisional wiring using the net list and simulation with provisional wiring load using a result of the provisional wiring are performed and data obtained as a result of the simulation with provisional wiring load is feedbacked to the step (c). This allows more proper block partitioning to be performed based on the provisional wire load.

The method of designing a semiconductor integrated circuit device further comprises, after the step (e), the steps of: (f) performing logic synthesis using design data described in the HDL to represent data on the modules and a wiring structure between the modules in a net list; and (g) performing placement and routing using the net list and outputting layout data, wherein placement and routing is performed in the step (g) by using the provisional placement data obtained in the step (b) and data on the blocks obtained in the step (c) and after the step (g), simulation with actual wire load using the layout data is performed and data obtained as a result of the simulation with actual wire load is feedbacked to the step (c). This allows more proper block partitioning to be performed based on the actual wire load.

More preferably, any two or more of the data obtained as a result of the RTL simulation, the data obtained as a result of the simulation with provisional wiring load, and the data obtained as a result of the actual wire load are feedbacked.

In the step (c), respective contribution rates of lengths of the wires between blocks are designated as the weights of signal lines between blocks. This allows block partitioning to be performed in consideration of delay.

In the step (c), respective contribution rates of capacitances of the wires between blocks are designated as the weights signal lines between blocks.

In the step (c), respective contribution rates of transition frequencies of the wires between blocks are designated as the weights of signal lines between blocks. This also allows block partitioning to be performed in consideration of a reduction in power consumption.

In the step (c), respective contribution rates of lengths and transition frequencies of the wires between blocks are more preferably designated as the weights of signal lines between blocks.

By feedbacking the data obtained as a result of the RTL simulation, the data obtained as a result of the simulation with provisional wiring load, the data obtained as a result of the actual wire load, or the like to the sub-step (a1) in the step (a), block partitioning can be performed after performing optimum transformation by using the result of simulation on the low level design.

By feedbacking the data obtained as a result of the RTL simulation, the data obtained as a result of the simulation with provisional wiring load, the data obtained as a result of the actual wire load, or the like to the sub-step (a2) in the step (a), block partitioning can be performed after performing optimum allocation and binding by using the result of simulation on the low level design.

BRIEF DESCRIPTION OF THE DRAWINGS

FIG. 1(a) is a flow chart illustrating the flow of high-level synthesis used in the present invention and FIGS. 1(b) to 1(f) show an example of data outputted in each of the steps;

FIGS. 2(a) to 2(d) show the process of transformation;

FIGS. 12(a) and 12(b) show a first CDFG generated in the second embodiment;

FIG. 13 illustrates a first weight of signal lines between modules for a signal line connecting modules in second to fourth embodiments of the present invention;

FIGS. 28(a) and 28(b) show an example of an approach to reducing power consumption by applying in-line expansion to transformation in the seventh embodiment; and FIGS. 29(a) and 29(b) illustrate the process of rebinding performed in the seventh embodiment.

DETAILED DESCRIPTION OF THE INVENTION

As an introduction to the description of the embodiments of the present invention, a description will be given to the concept of "high-level synthesis" used in the present invention.

Basic Flow of High-Level Synthesis

Figure 1A:
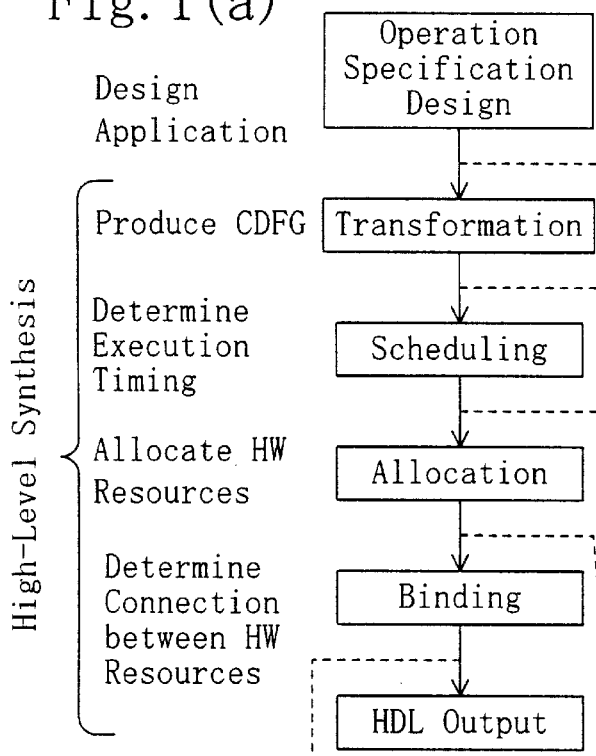

FIG. 1(a) is a flow chart illustrating the flow of high-level synthesis used in the present invention. FIGS. 1(b) to 1(e) show an example of data outputted in each of the steps.

Figure 1B:
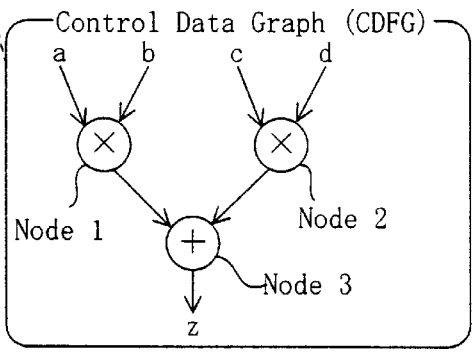

First, an application is obtained by designing operation specifications. FIG. 1(b) shows an example of a C language program. In this example, it is assumed that a, b, c, d, x, y, z are inputted and a description about a function main ( ) for executing the operations of $x=a\times b$, $y=c\times d$, and $z=x+y$ are included in the program. A program in the C language or the like includes a description (operational description) representative of a behavior (an operation) and such a program in which a behavior is described is also termed a behavioral description (application program).

Next, the description in the behavioral description is analyzed by transformation such that an optimization process including reductions in the respective numbers of operations and stages and the expansion of a loop is performed to implement hardware. The resulting data flows and processes performed with respect to the data are converted into a CDFG (control data flow graph) represented by arcs (arrows indicative of the directions of data flows) and nodes.

In this example, there are appearing the individual data flows represented by the arcs, the node 1 representing the adding operation between data a and b, the node 2 representing the adding operation between data c and d, and the node 3 representing the multiplying operation between the respective results of the processes of the nodes 1 and 2, as shown in FIG. 1(c).

Next, the portions representing the respective processes (nodes) in the CDFG are allocated to individual clock cycles on a time axis by scheduling, whereby an execution timing (step) for each of the processes is determined. In this example, the execution timings are determined by initially performing the process of the node 1 in step 1, performing the process of the node 2 in step 2, and then performing the process of the node 3 in step 3.

Next, from a library storing the HW resources (operating devices), the HW resources of the types corresponding to the respective types of the processes are selected and allocated to the nodes. In this example, multipliers (MPY) are allocated to the nodes 1 and 2 and an adder (ADD) is allocated to the node 3. Such a flow graph in which operating devices are allocated to nodes in a CDFG is termed an HW resource connection graph.

Figure 1F:
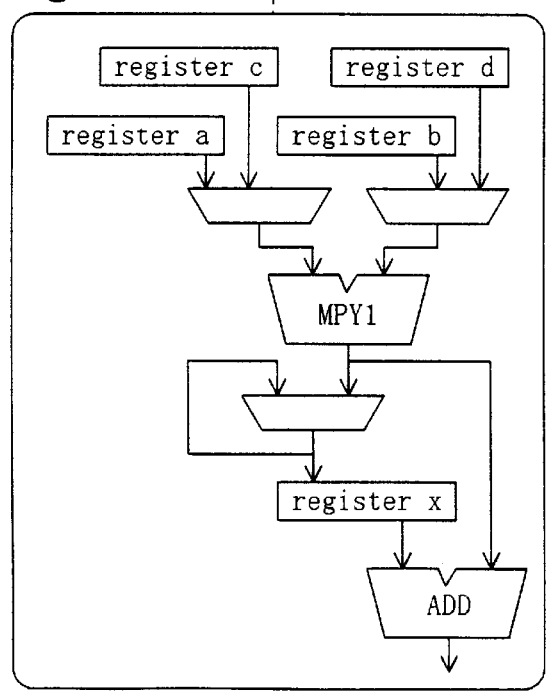

Next, the final connection between the HW resources are determined by binding. If the HW resources assigned by allocation are connected without any alterations, a circuit area becomes enormously large so that a system is maximally simplified by sharing the HW resources that can be shared. Since scheduling is performed in this example such that the multipliers (MPY) allocated to the nodes 1 and 2 do not operate with the same timing, as shown in FIG. 1(f), the multiplier (MPY1) which is a sharable, common HW resource can be used. By placing registers for holding data a, b, c, and d and the result of a multiplication and a multiplexer for switching data inputs to the multiplier (MPY1), a circuit for implementing the performance of the function main ( ) in the C language program shown in FIG. 1(b) is generated.

The eventually generated circuit is outputted as a description of RTL (register/transfer-level) logic data in an HDL, which is a hardware description language. The representatives of the HDL include Verilog-HDL and VHDL. The HDL description outputted by high-level synthesis contains data on blocks and a hierarchical structure resulting from a partitioning performed in the high-level synthesis.

Next, the aforementioned processes of transformation, scheduling, allocation, binding, and the like will be described in greater detail.

Transformation

FIGS. 2(a) to 2(d) show the process of transformation. As described above, transformation is the operation of optimizing the operational description in the behavioral description (application program) for hardware implementation and transforming the behavioral description into the CDFG.

For this purpose, the numbers of operations and stages are reduced by using the distributive law and the commutative law, as shown in, e.g., FIG. 2(a). For example, "A×B+A×C" is transformed into "A(B+C)" by using the distributive law so that the number of operations, i.e., the number of multiplications is reduced. By transforming "((A+B)+C)+D" into "(A+B)+(C+D)", the number of stages can be reduced from 3 to 2.

Besides, design is organized into hierarchical/non-hierarchical structures, as shown in FIG. 2(b). For example, if there is Function A which is a function including processes 1, 2, and 3, Function A is organized into a hierarchical structure consisting of Function B for performing the process 1, Function C for performing the process 2, Function D for performing the process 3, and Function A in which Functions B, C, and D are integrated. Conversely, if there are Function A-Functions B, C, and D in a hierarchical structure, they are organized into Function A, which is a single function in a non-hierarchical structure.

Additionally, expansion of a loop is performed, as shown in FIG. 2(c). For example, if three data strings are processed by switching inputs to the process A, three processes A are arranged in parallel such that data processing is performed in three flows.

As shown in FIG. 2(d), a CDFG (control data flow graph) showing nodes representing such operations as multiplication and addition and data flows relative to the nodes is outputted as the result of transformation. These processes need not necessarily be performed in the sequence shown in FIGS. 2(a) to 2(d) and can be performed by changing the sequence thereof as required. Alternatively, it is possible to simultaneously perform the plurality of processes in FIGS. 2(a) to 2(d).

Scheduling

As described above, scheduling is the determination of the timing with which each of the operations in the behavioral description is executed. The scheduling can be roughly subpartitioned into scheduling for restricting time and scheduling for restricting the HW resources.

As examples of scheduling algorithms, there are ASAP scheduling, ALAP scheduling, list scheduling, Force Directed scheduling, and integer programming.

As means for expanding the scheduling algorithm, there are pipeline scheduling, a multicycle operation, chaining of operations, a pipelined operating device, scheduling of a conditional statement, and speculative execution.

Figure 3A:
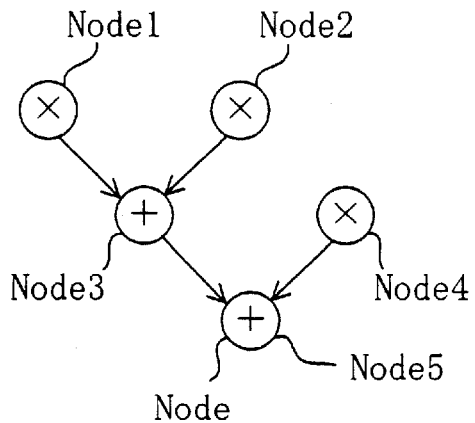
FIGS. 3(a) and 3(b) show the process of typical scheduling.

In accordance with an example of scheduling, if the CDFG shown in FIG. 3(a) is inputted, the process of the node 1 is performed in Step 1, the process of the node 2 is performed in Step 2, the processes of the nodes 3 and 4 are performed in Step 3, and the process of the node 5 is performed in Step 4.

Figure 4A:
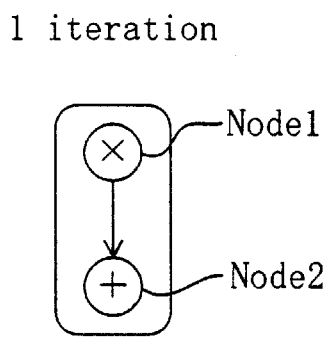
FIGS. 4(a) and 4(b) illustrate pipeline scheduling.
Figure 4B:
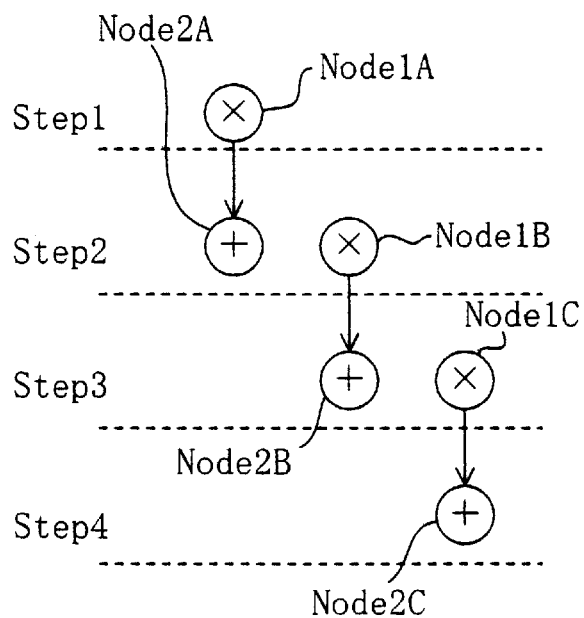

FIGS. 4(a) and 4(b) illustrate an example of the pipeline scheduling. If there is a description such that the process of performing the process of the node 2 after performing the process of the node 1 is iterated a plurality of times as shown in FIG. 4(a), the dependent relation between the iterations (iterated processes) is analyzed. Since pipelining is possible if there is no dependent relation, scheduling is performed such that operations are executed in an overlapping manner between the individual iterations. For example, the processes of the nodes 1A to 2A are performed in Steps 1 and 2, the process of the nodes 1B to 2B are performed in Steps 2 and 3, and the processes of the nodes 1C to 2C are performed in Steps 3 and 4 as shown in FIG. 4(b), whereby the throughput is more improved than in the case where the individual processes are performed in series.

Allocation

As described above, allocation is the allocation of proper HW resources to nodes in the CDFG. By the allocation, an HW resource connection graph is generated and the types and numbers of the HW resources are determined. However, it is necessary to use the HW resources preliminarily stored in the library and consider a tradeoff between performance and cost.

Figure 5A:
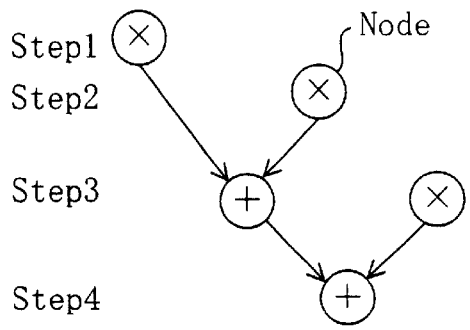
FIGS. 5(a) to 5(c) illustrate the process of allocation.
Figure 5B:
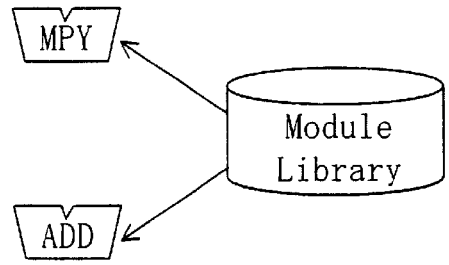
Figure 5C:
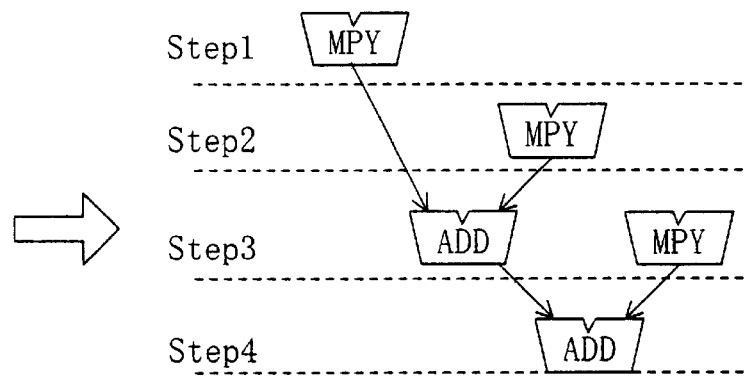

FIGS. 5(a) to 5(c) illustrate the process of allocation. As shown in FIG. 5(a), scheduling has determined respective execution timings for the multiplying operation and adding operation of the nodes in the CDFG. Then, as shown in FIG. 5(b), such operating devices as a multiplier (MPY) and an adder (ADD) are retrieved from Module Library, as shown in FIG. 5(b), so that the multipliers and the adders are allocated to the individual nodes, as shown in FIG. 5(c). By the process, the HW resource connection graph is generated.

Binding

Figure 6A:
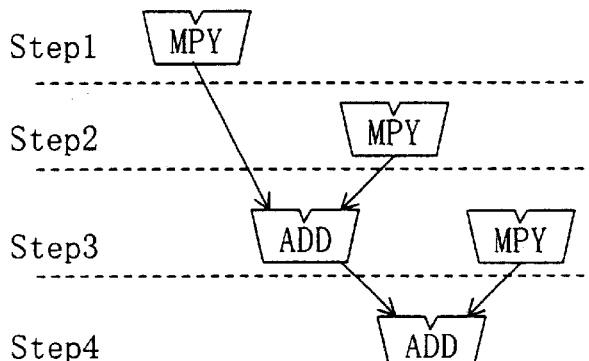
FIGS. 6(a) and 6(b) illustrate the process of binding.
Figure 6B:
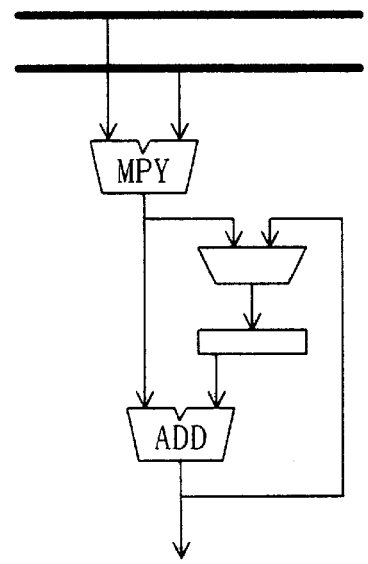

FIGS. 6(a) and 6(b) illustrate the process of binding. For example, it is assumed that the HW resource connection graph in which the multipliers (MPY), the adders (ADD), and the like have been assigned to the nodes by allocation are inputted, as shown in FIG. 6(a). At this time, the multiplier (MPY) which is a sharable HW resource is shared during three multiplications and registers are allocated to data, while buses for transferring data between the operating devices and the registers are generated. This has brought about the state in which the final circuit configuration is appearing.

Since the HW resources to be used are determined at the completion of binding, the size of each of the blocks and the block-to-block distances between blocks can be estimated finally in the high-level synthesis based on the HW resource data.

Figure 7A:
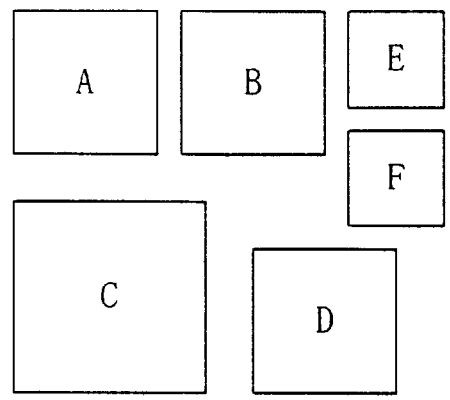
FIGS. 7(a) and 7(b) show a method of estimating the size of each of blocks and the distance between the blocks, respectively.
Figure 7B:
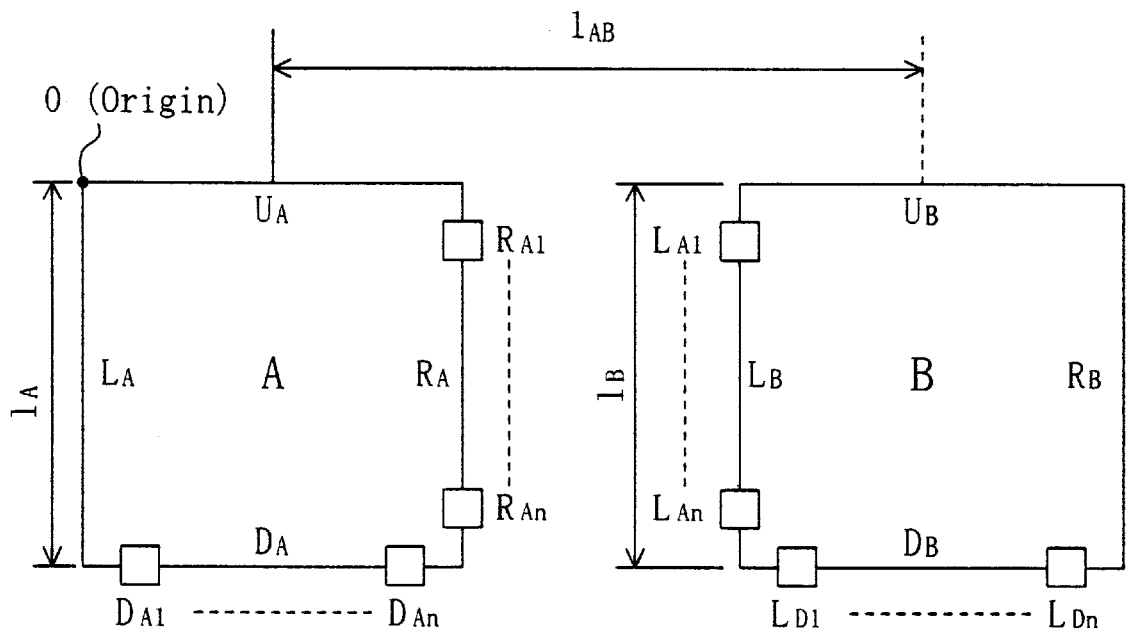

FIGS. 7(a) and 7(b) illustrate a method of estimating the respective sizes of the blocks and the block-to-block distances. As shown in FIG. 7(a), it is assumed that the system has been partitioned into the blocks A to F. As shown in FIG. 7(b), it is assumed that the blocks A and B are squares having the respective sides $I_A$ and $I_B$, the distance between the respective centers of the blocks A and B is $I_{AB}$, and $I_{AB} > (I_A+I_B)/2$ is satisfied. It is also assumed that the block A has the sides $U_A$, $D_A$, $R_A$, and $L_A$ and the block B has the sides $U_B$, $D_B$, $R_B$, and $L_B$.

At this time, it is assumed that a wire connecting the blocks A and B is provided between the sides $R_A$ and $L_B$. Accordingly, the sides $R_A$ and $L_B$ are given as pin position data for the wire to position determining data. Likewise, a wire connected to a block (such as C) opposed to the side $D_A$ of the block A is also given to the position determining data. If the wires have been prioritized by wiring data, $R_{A1}$, $R_{A2}$, ... and $R_{An}$ are given as pin position data in decreasing order of priority to the position determining data. If the respective weights of the wires have been calculated, they are also added.

The respective positions of the blocks are determined by selecting a block serving as a reference (e.g., the block A) and assuming the corner at which the sides $U_A$ and $L_A$ of the block A intersect to be the origin. Thereafter, the coordinate positions of the respective centers of the blocks A to F are added as data on the position of the block to the position determining data. For example, the coordinate position of the block A is $(I_A/2, I_A/2)$ and the coordinate position of the block B is $((I_A/2)+1_{AB}, I_B/2)$.

Design after High-Level Synthesis

In an HDL after the high-level synthesis is completed, the content of the system to be designed is described on the RTL. The system is constituted by the following circuit units (elements).

That is, a plurality of operating devices collectively constitute one module. The module is defined herein as a circuit unit consisting of the plurality of operating devices to implement a single function. The single function indicates, e.g., address generation, error correction, or the like.

A plurality of modules collectively constitute a block. The block is defined herein as a circuit unit consisting of the plurality of modules to implement a composite function. For example, a processor, an engine obtained by implementing, with dedicated HW, a process which cannot provide satisfactory performance if it is performed by a processor (SW), and the like constitute one block. Subsequently, logic synthesis is performed to convert a logic block described on the RTL in an HDL to a net list composed of a combination of macrocells suitable for implementing the function. The process is normally performed by using a tool for automatic logic synthesis. As the tool for automatic logic synthesis, there have been developed various tools using Verilog-HDL and VHDL as input data. The net list generated by the logic synthesis is composed of actually used macrocells and connection data between macrocells.

Figure 8:
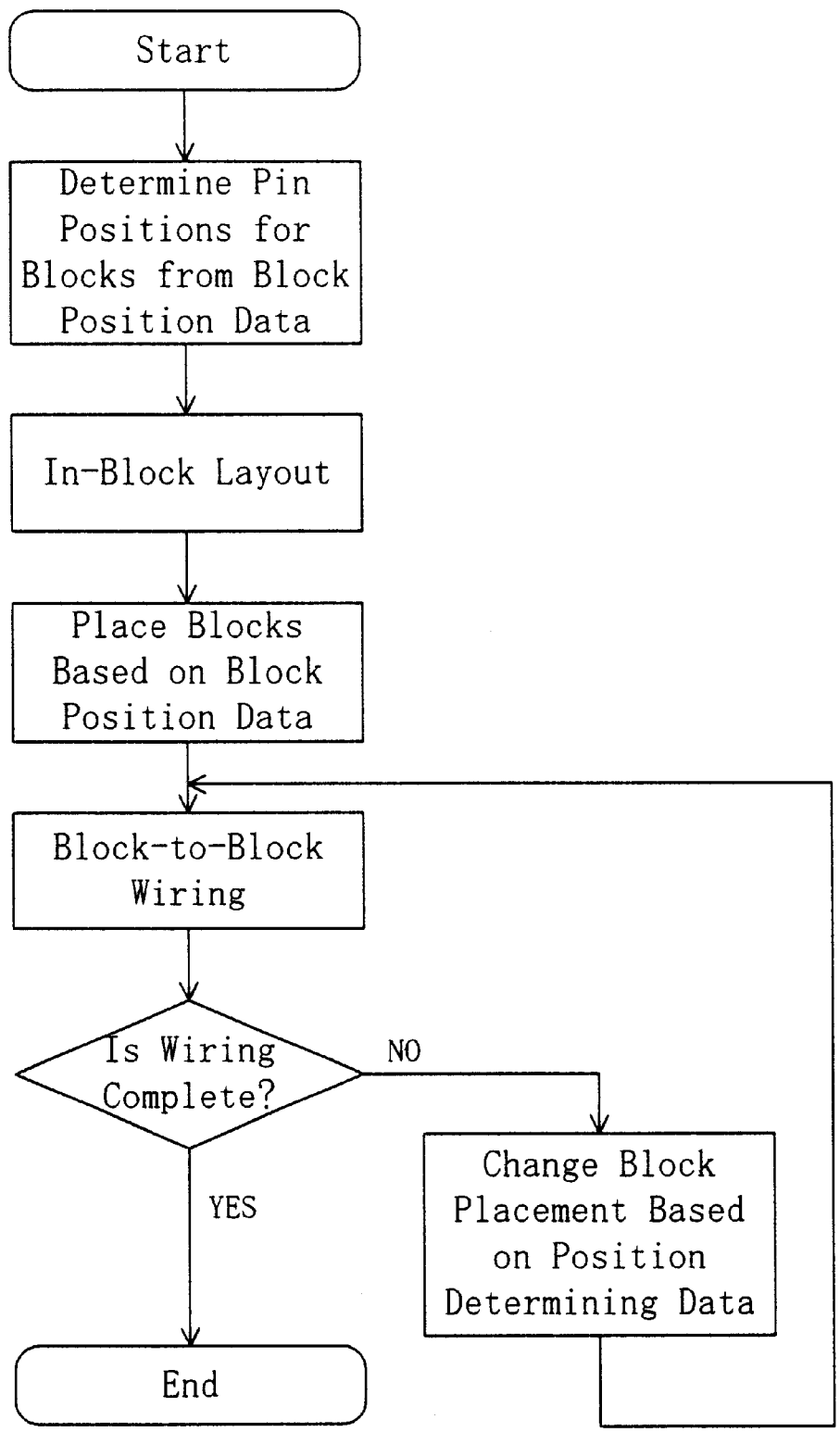
FIG. 8 is a flow chart schematically illustrating an example of the procedure of placement and routing.

Next, placement and routing (layout design) using data given by the net list is performed. FIG. 8 is a flow chart schematically showing an example of the procedure of placement and routing.

First, a pin position is determined for each of blocks based on pin position data included in block position data. Then, layout (placement and routing) within each of the blocks and the like are performed. Subsequently, each of the blocks is placed based on the coordinates of the block included in the block position data.

After the blocks are placed, wires between blocks is performed. If the wiring process is not completed due to a dearth of area in a wiring region or the like, the blocks are replaced by increasing the space between the blocks, while considering the coordinates in the position determining data and wiring priority (or weight) if any, whereby wiring between blocks is performed again.

The foregoing is the outline of the procedure of designing a semiconductor integrated circuit device as the introduction to each of the embodiments of the present invention. A description will be given below to the individual embodiments having the characteristic portions of the present invention.

EMBODIMENT 1

In the present embodiment, a description will be given to a method of proceeding to the low level design, while holding power consumption and delay proper in each of signal lines between blocks, by performing rough block partitioning with respect to a behavioral description (application program) and then checking whether or not the block partitioning is proper in high-level synthesis.

Figure 9:
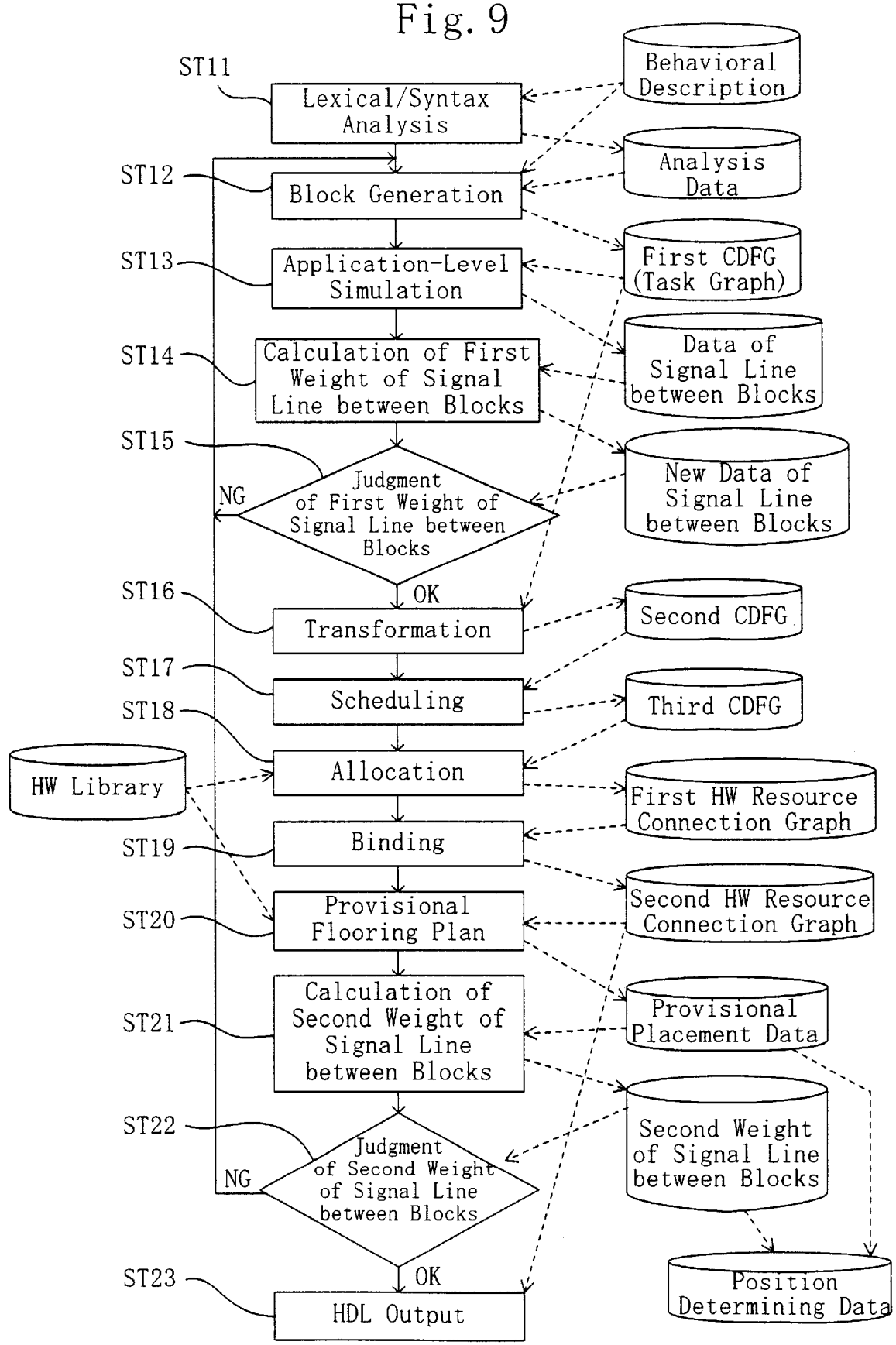
FIG. 9 is a flow chart illustrating a method of designing a semiconductor integrated circuit device in a first embodiment of the present invention.

FIG. 9 is a flow chart showing the procedure of a method of designing a semiconductor integrated circuit device in the present embodiment.

First, in Step ST11, a program in a behavioral description is fetched from a database and subjected to lexical/syntax analysis such that an error in the behavioral description and a function included in a system represented in the behavioral description are examined. The detection of the error is performed automatically by a process similar to a typical compiler. The function included in the system is represented in a combination of functions having a given capability or in a single function and detected by the lexical/syntax analysis or the like. The capability is stored as analysis data in a memory.

Next, in Step ST12, blocks are generated (block partitioning) by using the behavioral description and the analysis data. Then, a first CDFG (task graph) showing connections between the blocks to a certain degree is stored in the database. The difference between the initial block partitioning and block partitioning (repartitioning) upon receipt of a feedback will be described later with reference to FIGS. 25(a) and 25(b).

Figures 10A, 10B:
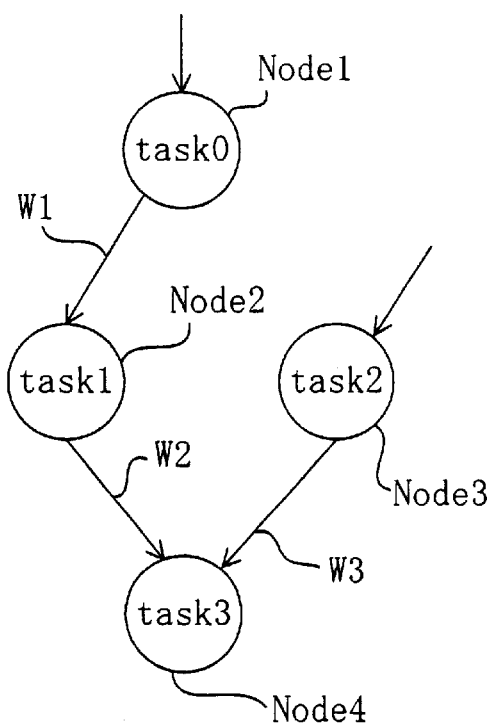
FIGS. 10(a) and 10(b) show a first CDFG generated in the first embodiment and the content of each of the nodes in the first embodiment.

FIGS. 10(a) and 10(b) show the first CDFG generated in Step ST12 and the respective contents of the nodes. The first CDFG is different from the CDFG (second CDFG in the present embodiment) shown in FIG. 1(c) or 2(d) in that not operating processes but tasks 0 to 3 are positioned therein. Each of the tasks (processes) is composed of a plurality of functions in the program, as shown in FIG. 10(b). The task performs one complete function processed dependently by several operating processes. Specifically, in Step ST12, a task as shown in FIG. 10(a) is partitioned into blocks.

Next, in Step ST13, the first CDFG is fetched and application-level simulation is performed in which an actual application is operated. By the application-level simulation, a transition frequency and an active ratio in each of the signal lines between blocks are determined.

Next, in Step ST14, the weight of each of the signal lines between blocks calculated from profile data made clear by the application simulation is calculated as a first weight of signal lines between blocks W. In Step ST12 as the first step, any initial value (e.g., a constant value) is given as the weight W and the application simulation allows actual weights W1 to W3 to be calculated, as shown in FIG. 10(a). If the tasks 0 to 4 are blocks, the types of calculations performed and the type and amount of data transferred during the actual process are obtained as the profile data so that the weight W is calculated as a function of the transition frequency (including the active ratio) in the signal line between blocks. A specific method of calculating the weight will be described later with reference to FIGS. 26(a) and 26(b). It is assumed here that W=F (wire transition frequency) is satisfied.

Next, in Step ST15, it is judged whether or not the first weight of signal lines between blocks is proper. The judgment is performed by, e.g., comparing the first weight of signal lines between blocks W of each of the signal lines with a predetermined first threshold value. Specifically, if the first weight of signal lines between blocks W of a certain signal line is exceeding the first threshold value (NG), power consumption in that portion may increase so that it is necessary to perform the process of subpartitioning the blocks into smaller units or the process of changing a method for block partitioning. As a result, the whole process returns to Step ST12 where blocks are generated again (block repartitioning).

Figure 1D:
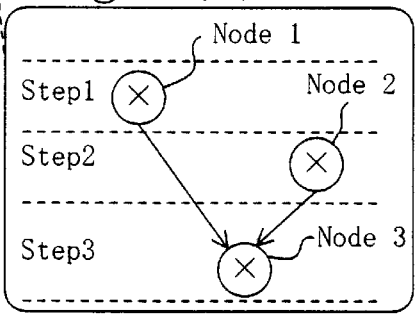
Figure 3B:
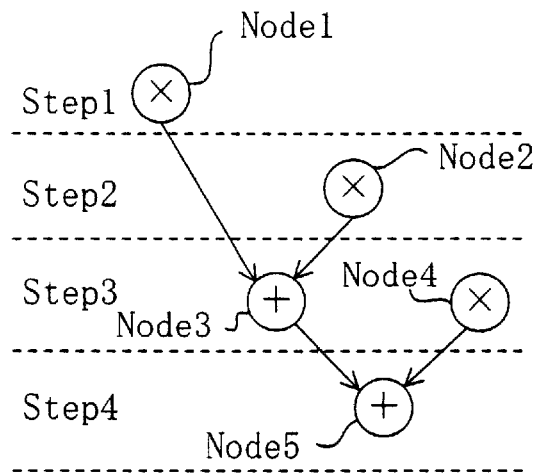

If the first weight of signal lines between blocks of each of the signal lines is not exceeding the first threshold value (OK), the whole process advances to Step ST16 where the first CDFG is fetched and the foregoing transformation is performed. By the transformation, a second CDFG as shown in FIG. 1(c) or 2(d) is generated. At this stage, the content of each of the tasks is represented in the CDFG and each of the nodes contains an operating device. Next, in Step ST17, scheduling is performed and execution timings for the respective processes (nodes) in the second CDFG are allocated to clock cycles such that a third CDFG as shown in FIG. 1(d) or 3(b) is generated.

Figure 1E:
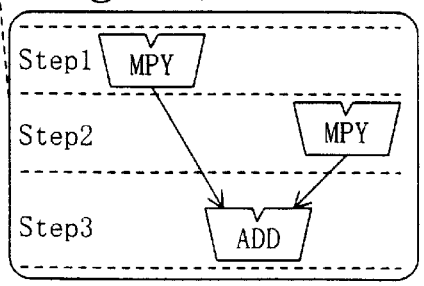

Next, in Step ST18, HW scale data in the HW library is fetched and the foregoing allocation is performed in accordance with the third CDFG. As a consequence, a first HW resource connection graph as shown in FIG. 1(e) or 5(c) is generated.

Next, in Step ST19, the foregoing binding is performed in accordance with the first HW resource connection graph. If there is a sharable HW resource, it is shared as stated previously such that a second HW resource connection graph as shown in FIG. 1(f) or 6(b) is generated and a state machine for controlling each of the HW resources on the second HW resource connection graph is generated.

Next, in Step ST20, provisional floor planning is performed. Floor planning is defined as the process of examining and determining how the blocks should be placed in a chip. Provisional floor planning is defined as the process of calculating the block-to-block distances by extracting the HW scale data stored preliminarily in the HW library therefrom, provisionally estimating the size of each of the blocks, and provisionally placing the blocks. In the present embodiment, the HW scale data is fetched from the HW library in accordance with the method shown in FIGS. 7(a) and 7(b) and the distances between the individual HW resources on the second HW resource connection graph are determined. Then, each of the HW resources on the second HW resource connection graph is provisionally placed and provisional placement data is outputted. At this time, the distances between the HW resources serve as a guideline for determining an approximate wire length.

Then, in Step ST21, a second weight of signal lines between blocks W' is calculated by considering the wire length determined based on a sufficiently large block-to-block distance, a wire capacitance, and the like in addition to the judged weight of the wire between blocks. An example of a method for the calculation will be described later.

Next, in Step ST22, it is judged whether or not the second weight of signal lines between blocks W' is proper. Specifically, it is judged whether or not the second weight of signal lines between blocks W' is smaller than a second threshold value, similarly to Step ST15, and, if the second weight of signal lines between blocks W' of each of the signal lines is smaller than the second threshold value (OK), the whole process advances to Step ST23 where an HDL is outputted.

If at least one of the second weights of signal lines between blocks W' is equal to or larger than the second threshold value (NG), the whole process returns to Step ST12 where blocks are generated again. For example, the present embodiment combines the tasks 0 and 1 shown in FIG. 10(a) with each other to form one block or incorporates some of the functions in the task 1 into the task 2 as another task. By thus changing the method of building blocks, the block-to-block distances are changed and then the processes in Steps ST13 to ST22 are performed again.

Before returning to Step ST12, it is also possible to return to Step ST12 after performing the step of reducing the second threshold value. The changing of the second threshold value can be performed automatically by, e.g., setting the initial second threshold value such that it increases at a given rate.

The present embodiment exerts the following effects.

In general, it is known that power consumption in a signal line is determined by a signal transition frequency, a wire capacitance (proportional to a wire length), a power-source voltage, an operating frequency, and the like. It is also known that a delay in a wire becomes a function of the wire length. In high-level synthesis on the high level design, therefore, design in consideration of power consumption and a delay in a signal line has not conventionally been performed yet since placement and routing had not been performed yet and the wire length or the like has not been determined yet. It was not until placement and routing is performed on the low level design and power consumption and delay in some of the signal lines prove to be excessive that the whole process returns to the high level design and performs high-level synthesis again. To circumvent the need to frequently perform high-level synthesis again, therefore, the designer is required to have experience and ability.

By contrast, the present embodiment enables efficient block partitioning, while reducing power consumption and delay, by obtaining data for block partitioning quantitative to a characteristic inherent to the application, i.e., an amount of communication between the blocks and the wire length obtained as a result of the provisional floor planning and performing block partitioning (and repartitioning) in terms of reducing power consumption and delay without being limited to block partitioning (generation) represented on the level of the behavioral description of the system or to block partitioning based on human experiment. Since a signal line between blocks is normally longer than an in-block signal line, the effects of reducing power consumption and the like are enhanced by performing block partitioning in consideration of the weight of signal lines between blocks.

Although the block partitioning in accordance with the function of the behavioral description is performed in Step ST12, the flow of calculating the weight from the signal transition frequency without considering the wire length in Step ST14, judging the properness of the weight of signal lines between blocks in Step ST15, and generating blocks again in Step ST12 is repeated thereafter, so that proper block partitioning is performed at the stage of Step ST15 such that power consumption and delay in each of signal lines between blocks are not excessive. This reduces the probability of performing repartitioning due to the second weight of signal lines between blocks which becomes equal to or more than the second threshold value in the processes subsequent to transformation.

By performing the conventional processes of high-level synthesis, i.e., transformation, scheduling, allocation, and binding in Steps ST16 to ST21 and then performing the process of optimizing power consumption and each wire delay between blocks by using data on the length of each of the wires between blocks obtained by provisional floor planning and in consideration of the signal transition frequency and the wire length, it becomes possible to lower the frequency with which high-level synthesis should be performed again due to power consumption and wire delay between blocks which become excessively large after the high-level synthesis.

Since each of the processes from Steps ST11 to ST23 can be performed automatically except for the setting of the first and second threshold values, only an extremely short period is required to perform the processes of Steps ST11 to ST23.

It is to be noted that the present embodiment is capable of performing logic synthesis and placement and routing by generating modules on the low level design in the state in which block placement is nearly optimized.

EMBODIMENT 2

In the present embodiment, a description will be given to a method of building blocks by performing module partitioning prior to transformation and calculating weights between the modules by application-level simulation.

Figure 11:
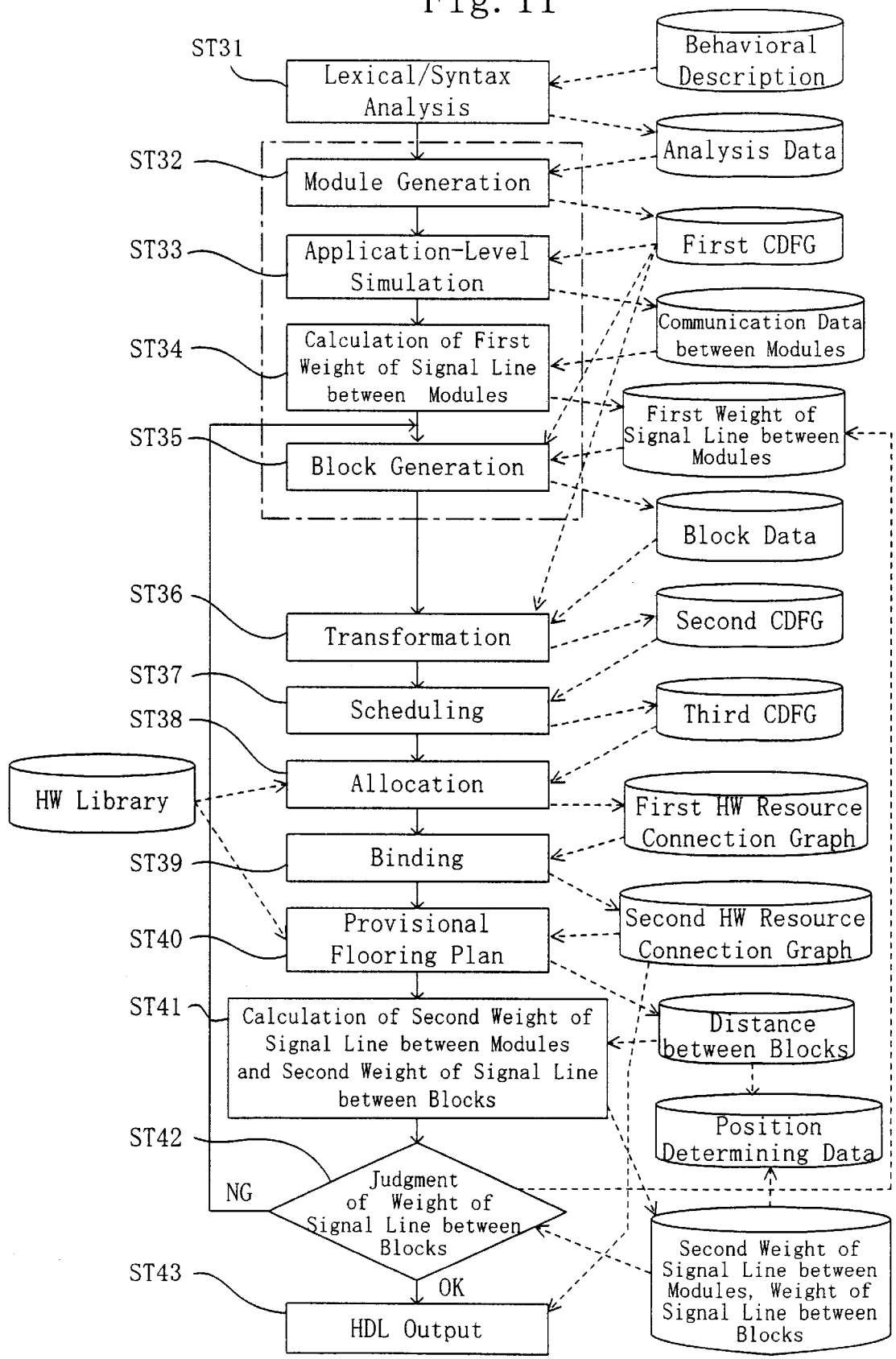
FIG. 11 is a flow chart illustrating the procedure of a method of designing a semiconductor integrated circuit device in a second embodiment of the present invention.

FIG. 11 is a flow chart showing the procedure of a method of designing a semiconductor integrated circuit device in the present embodiment.

First, in Step ST31, a program in a behavioral description is fetched from a database and subjected to lexical/syntax analysis such that the presence or absence of an error in the behavioral description is checked and functions (operations) included in a system represented in the behavioral description are examined, similarly to the first embodiment. Then, the functions obtained as a result of the analysis are stored as analysis data in a memory.

Next, in Step ST32, modules for partitioning the whole application into blocks based on the analysis data are generated. Then, a first CDFG designating, as nodes, operational functions within the modules is generated and stored in the memory.

FIG. 12 shows the first CDFG generated in the present embodiment. The nodes 1 to 4 in the first CDFG are operating devices such as a comparator, an adder, and a multiplier. The plurality of operating devices constitute one module.

Next, in Step ST33, the first CDFG is fetched such that application-level simulation for operating an actual application is performed. By the application-level simulation, the amount of data communication in each of wires between modules is determined.

Next, in Step ST34, the weight of each of signal lines between modules is calculated as a first weight of signal lines between modules w from profile data made clear by the application simulation. Since the type and amount of data transferred between the modules are obtained as the profile data as a result of the application-level simulation, the first weight of signal lines between modules w is calculated as a function of the amount of data communication between the modules.

FIG. 13 illustrates the modules M1 to M7 and the first weights of signal lines between modules w1 to w12 of the signal lines connecting the modules M1 to M7. As shown in the drawing, the weights w1 to w12 of the respective wires between the modules have been determined in accordance with the amounts of data communication therebetween.

Next, in Step ST35, blocks are generated (grouping) by using the first CDFG and data on the weights of signal lines between modules. The blocks are generated from the weights of signal lines between modules such that the total sum of the amounts of data communication in the respective input/output signal lines of the blocks is minimized.

Next, in Step S36, the first CDFG is fetched and the foregoing transformation is performed. By the transformation, a second CDFG as shown in FIG. 1(c) or 2(d) is generated. Next, scheduling is performed in Step ST37 to allocate execution timings for the respective processes (nodes) in the second CDFG to clock cycles and thereby generate a third CDFG as shown in FIG. 1(d) or 3(b).

Next, in Step ST38, HW scale data in an HW library is fetched and the foregoing allocation is performed in accordance with the third CDFG. As a consequence, a first HW resource connection graph as shown in FIG. 1(e) or 5(c) is generated.

Next, in Step ST39, the foregoing binding is performed in accordance with the first HW resource connection graph. At this time, a second HW resource connection graph as shown in FIG. 1(f) or 6(b) is generated and a state machine for controlling each of the HW resources on the second HW resource connection graph is generated.

Next, in Step ST40, provisional floor planning is performed to fetch HW scale data from the HW library such that the distances between the individual HW resources on the second HW resource connection graph are determined in accordance with the foregoing method shown in FIG. 7(a) and 7(b). Each of the HW resources on the second HW resource connection graph is provisionally placed and provisional placement data is outputted. At this time, the distances between the HW resources serve as a guideline for determining an approximate wire length.

Then, in Step ST41, a second weight of signal lines between modules w' is calculated based on provisional wire load and on the first weight of signal lines between modules. Since the approximate wire length has been determined, the second weight of signal lines between modules can be calculated based on a value obtained by multiplying the amount of data communication between modules by the wire length. A specific method will be described later. The weight of the portion of the second weight of signal lines between modules w' which also serves as a wire between blocks is designated as the weight of signal lines between blocks W.

Figure 14:
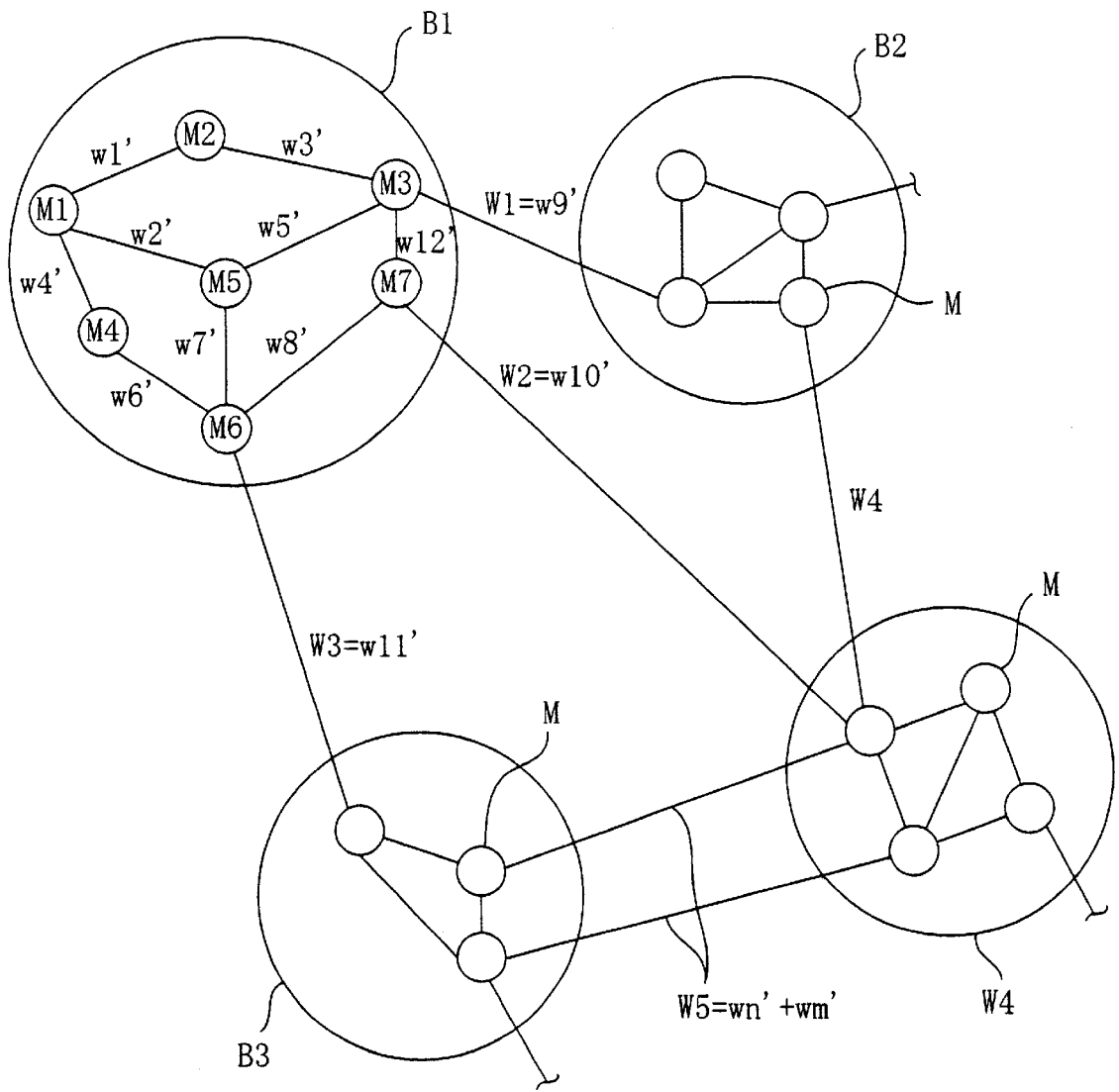
FIG. 14 shows the state resulting from block partitioning and weights of signal lines between blocks in the second to fourth embodiments.

FIG. 14 shows the state resulting from block partitioning. As shown in the drawing, each of the blocks B1 to B4 is composed of a plurality of modules. The second weights of signal lines between modules w' of the signal lines between modules which also serve as the wires between blocks are designated as the weights of signal lines between blocks W1 to W5. If there are a plurality of signal lines between modules between the blocks, the sum of the plurality of second weights of signal lines between modules (such as wn'+wm') constitute the weight of signal lines between blocks (such as W5). It is also possible to perform weighting incorporating, as the weight of signal lines between modules, only the wire length, a wire transition frequency, or a wire capacitance or weighting incorporating, as the weight of signal lines between modules, a combination of the wire capacitance and the wire transition frequency.

Next, in Step ST42, it is judged whether or not the weight of signal lines between blocks W is proper. Specifically, it is judged whether or not the weight of signal lines between blocks W is smaller than the threshold value thereof and, if each of the weights of signal lines between blocks is smaller than the threshold value (OK), the whole process advances to Step ST43 where an HDL is outputted.

If at least one of the weights of signal lines between blocks W is equal to or larger than the threshold value (NG), on the other hand, the whole process returns to Step ST35 where blocks are generated again. That is, after some of the signal lines between modules also serving as the signal lines between blocks are changed by changing the method of building the blocks from the modules, the processes of ST35 to ST42 are performed again.

The present embodiment can also perform block partitioning in consideration of power consumption and delay through module partitioning in high-level synthesis, basically similarly to the first embodiment. Since the blocks are formed by grouping the individual modules such that the amount of communication between the blocks and the wire length required by the application are reduced without being limited to block partitioning described on the level of the behavioral description of the system, power consumption and delay can be reduced by controlling the communication between the blocks and the wire capacitance.

In particular, the second embodiment is different from the first embodiment in that it partitions, from the beginning, the whole application into the units of modules, not into the units of blocks and groups the modules such that the blocks are formed of the modules. Accordingly, the second embodiment offers the advantage of generating the blocks more efficiently than in the first embodiment.

EMBODIMENT 3

In the present embodiment, a description will be given to a method of building blocks by performing module partitioning after transformation and calculating weights between the modules by application-level simulation.

Figure 15:
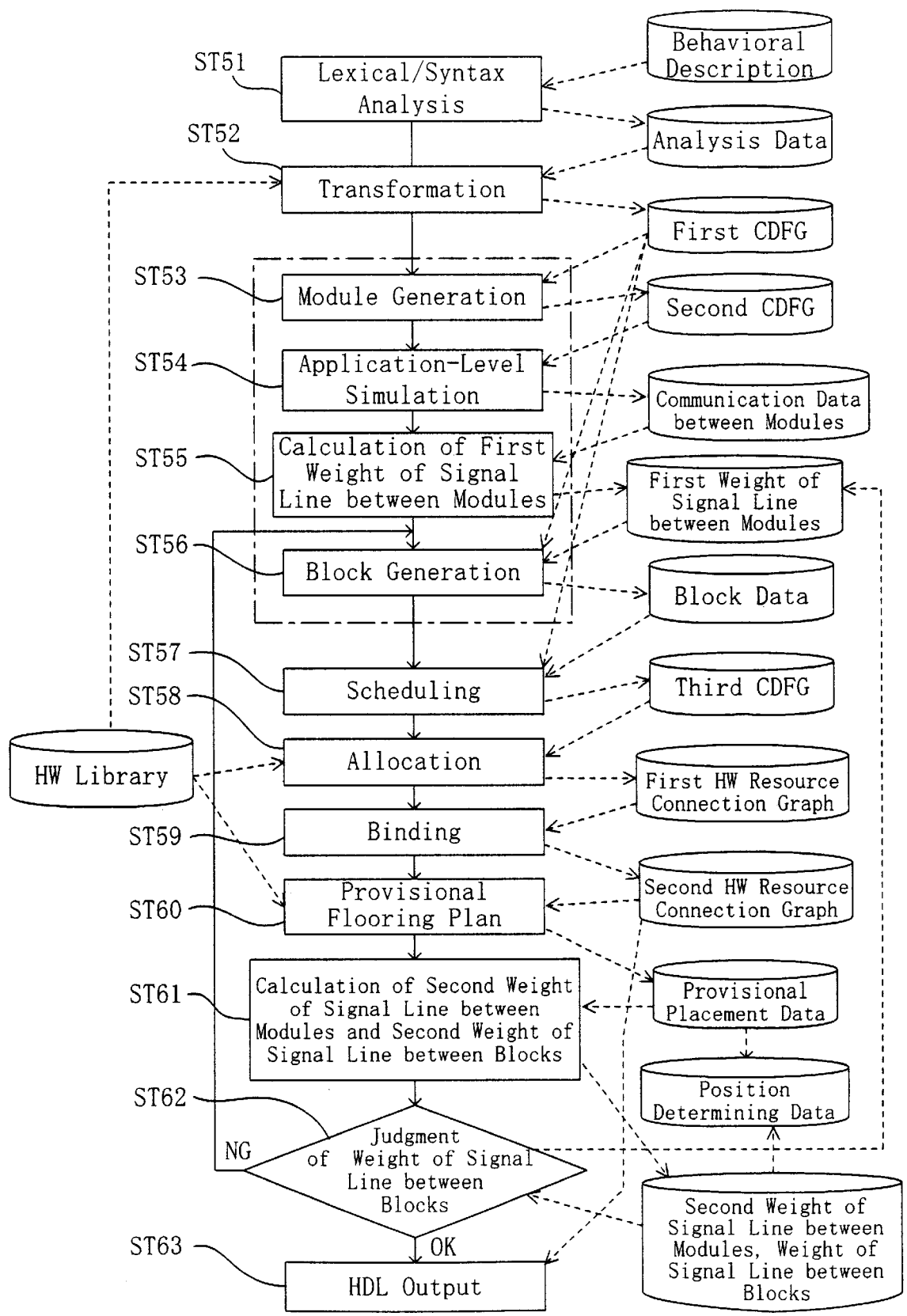
FIG. 15 is a flow chart showing the procedure of a method of designing a semiconductor integrated circuit device in the third embodiment.

FIG. 15 is a flow chart showing the procedure of a method of designing a semiconductor integrated circuit device in the present embodiment.

First, in Step ST51, a program in a behavioral description is fetched from a database and subjected to lexical/syntax analysis such that the presence or absence of an error in the behavioral description is checked and functions included in a system represented in the behavioral description are examined, similarly to the first embodiment. Then, the functions obtained as a result of the analysis is stored as analysis data in a memory.

Next, in Step ST52, the analysis data is fetched and the foregoing transformation is performed such that the analysis data is replaced with a circuit by using HW resources stored in an HW library. By the transformation, a first CDFG as shown in FIG. 12 is generated.

Next, in Step ST53, modules for partitioning the whole application into blocks are generated based on the analysis data. At this stage, a second CDFG showing the state in which the modules are composed of a plurality of nodes is generated and stored in the memory. Each of the nodes in the second CDFG is an operating device such as a comparator, an adder, or a multiplier. The plurality of operating devices constitute one module.

Then, in Steps ST54 to ST63, the same processes as performed in Steps ST33 to ST43 (except for Step ST36) of the second embodiment are performed.

Thus, the present embodiment is only different from the second embodiment in that module generation and block generation are performed after transformation.

Therefore, the present embodiment can basically achieve the same effects as achieved by the second embodiment.

In addition, the present embodiment offers the advantage of optimizing design by transformation, as will be described later, since module partitioning and block partitioning can be performed after data is feedbacked to the transformation.

EMBODIMENT 4

In the present embodiment, a description will be given to a method of generating blocks by performing the processes from transformation to binding, performing module partitioning, and calculating a weight between modules by application-level simulation.

Figure 16:
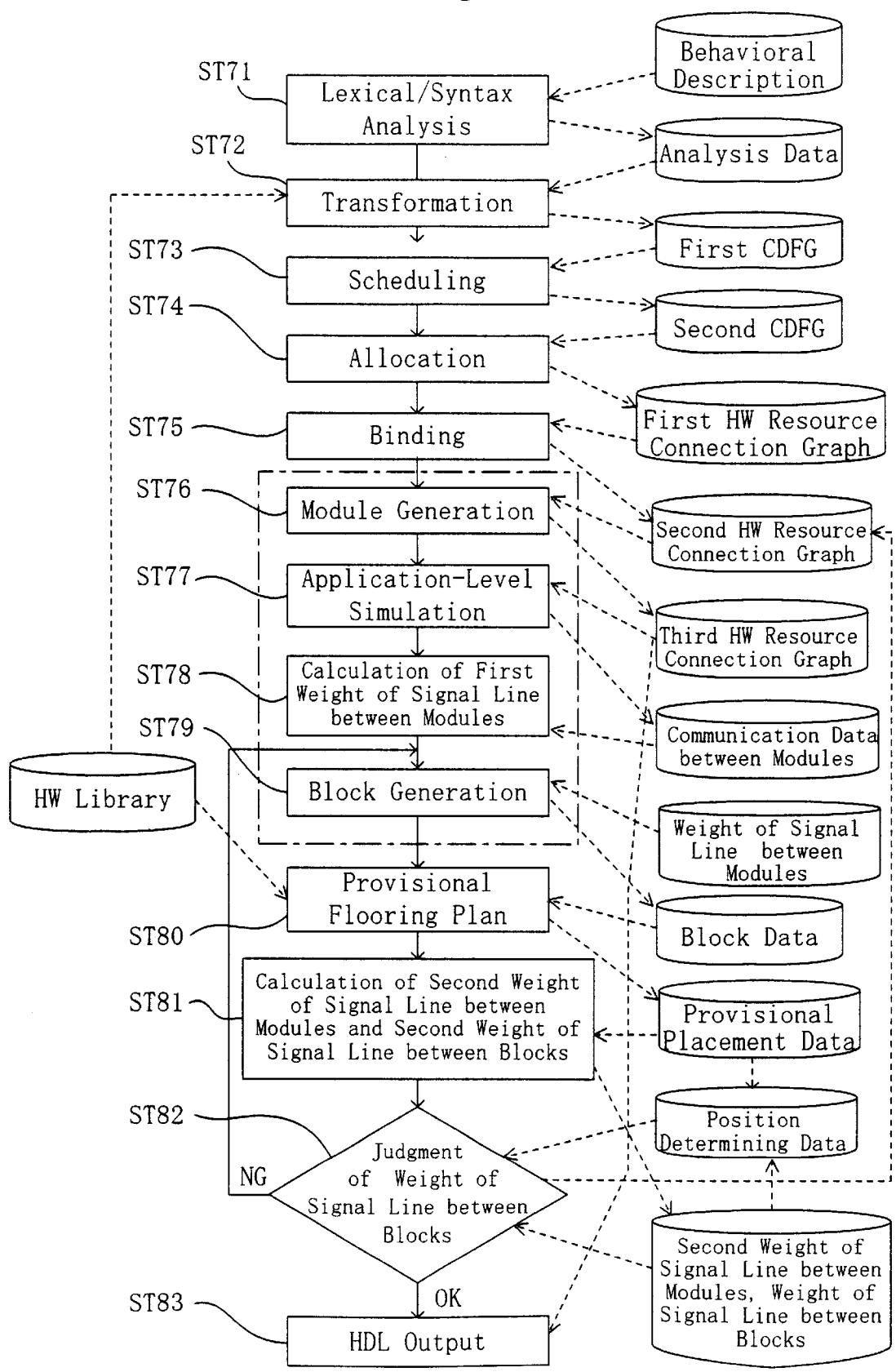
FIG. 16 is a flow chart showing the procedure of a method of designing a semiconductor integrated circuit device in the fourth embodiment.

FIG. 16 is a flow chart illustrating the procedure of a method of designing a semiconductor integrated circuit device in the present embodiment.

First, in Step ST71, a program in a behavioral description is fetched from a database and subjected to lexical/syntax analysis such that the presence or absence of an error in the behavioral description is checked and functions included in a system represented in the behavioral description are examined, similarly to the first embodiment. Then, the functions obtained as a result of the analysis are stored as analysis data in a memory.

Next, in Step ST72, analysis data is fetched and the foregoing transformation is performed such that the analysis data is replaced with a circuit by using HW resources stored in an HW library. By the transformation, a first CDFG as shown in FIG. 12 is generated.

Next, in Step ST73, scheduling is performed and execution timings for the processes (nodes) in the first CDFG are allocated to clock cycles, whereby a second CDFG as shown in FIG. 1(d) or 3(b) is generated.

Next, in Step ST74, HW scale data in the HW library is fetched and the foregoing allocation is performed in accordance with a third CDFG. As a consequence, a first HW resource connection graph as shown in FIG. 1(e) or 5(c) is generated.

Next, in Step ST75, the foregoing binding is performed in accordance with the first HW resource connection graph. At this time, a second HW resource connection graph as shown in FIG. 1(f) or 6(b) is generated and a state machine for controlling each of the HW resources on the second HW resource connection graph is generated.

Next, in Step ST76, the second HW resource connection graph is analyzed and the whole application is partitioned such that modules for building blocks are generated. At this stage, a third HW resource connection graph showing the state in which the modules are composed of a plurality of operating devices is generated and stored in a memory.

Next, in Step ST77, the third HW resource connection graph is fetched and application-level simulation for operating an actual application is performed. By the application-level simulation, the amount of data communication in each of wires between modules is determined.

Next, in Step ST78, the weight of each of signal lines between modules is calculated as a first weight of signal lines between modules w from the profile data made clear by the application-level simulation. Since the type and amount of data transferred between the individual modules are obtained as the profile data as a result of the application-level simulation, a first weight of signal lines between modules w as shown in FIG. 13 is calculated as a function of the amount of data communication between the modules.

Next, in Step ST79, blocks are generated (grouping) by using data on the weights of signal lines between modules. The blocks are generated from the weights of signal lines between modules such that the total sum of the amounts of data communication in the respective input/output signal lines of the blocks is minimized.

Next, in Step ST80, provisional floor planning is performed by fetching HW scale data from an HW library and determining the distances between the individual HW resources on the third HW resource connection graph in accordance with the foregoing methods illustrated in FIGS. 7(a) and 7(b). Then, each of the HW resources on the third HW resource connection graph is provisionally placed and provisional placement data is outputted. At this time, the distances between the HW resources serve as a guideline for determining an approximate wire length.

Then, in Step ST81, a second weight of signal lines between blocks W' is calculated based on the provisional placement data and on the first weights of signal lines between modules. Since the approximate wire length has been determined, the second weight of signal lines between modules can be calculated based on a value obtained by multiplying the amount of data communication between modules by the wire length. A specific method will be described later. As shown in FIG. 14, the weight of the portion of the second weight of signal lines between modules w' which also serves as a wire between blocks is designated as the weight of signal lines between blocks W.

Next, in Step ST82, it is judged whether or not the weights of signal lines between blocks W are proper. Specifically, it is judged whether or not the second weight of signal lines between blocks W is smaller than the threshold value thereof. If each of the weights of signal lines between blocks W is smaller than the threshold value (OK), the whole process advances to Step ST83 where an HDL is outputted.

If at least one of the weights of signal lines between blocks W is equal to or larger than the threshold value (NG), the whole process returns to Step ST79 where blocks are generated again. That is, the processes in Steps ST80 to ST82 are performed again after changing the method of building blocks and thereby changing some of the signal lines between modules which also serve as the signal lines between blocks.

The present embodiment can also perform block partitioning in consideration of power consumption and delay through module partitioning in high-level synthesis, basically similarly to the first embodiment.

In particular, the present embodiment performs module generation and block partitioning in Steps ST76 and ST79, respectively, after determining connections between the HW resources by transformation, scheduling, allocation, and binding performed in Steps ST52 to ST75. Since module generation is performed at the time at which the HW resources are allocated after binding, the modules are composed of a plurality of operating devices that have been optimized to an extent by, e.g., sharing the sharable HW resources. In contrast to the first to third embodiments in which binding between the modules or the tasks is impossible, the present embodiment can freely bind the HW resources on the first HW resource connection graph since such modules and blocks are not generated. This improves the efficiency of design by considering power consumption and delay, while using the HW resources of the entire system particularly effectively.

Since the present embodiment permits module partitioning and block partitioning to be performed after feedbacking data to transformation or binding, it offers the advantage of optimizing design by transformation or binding, which will be described later.

EMBODIMENT 5

In the present embodiment, a method of performing logic synthesis and placement and routing after performing at least any one of the high-level syntheses of the first to fourth embodiments will be described according to each of the following specific examples.

SPECIFIC EXAMPLE 1

Figure 17:
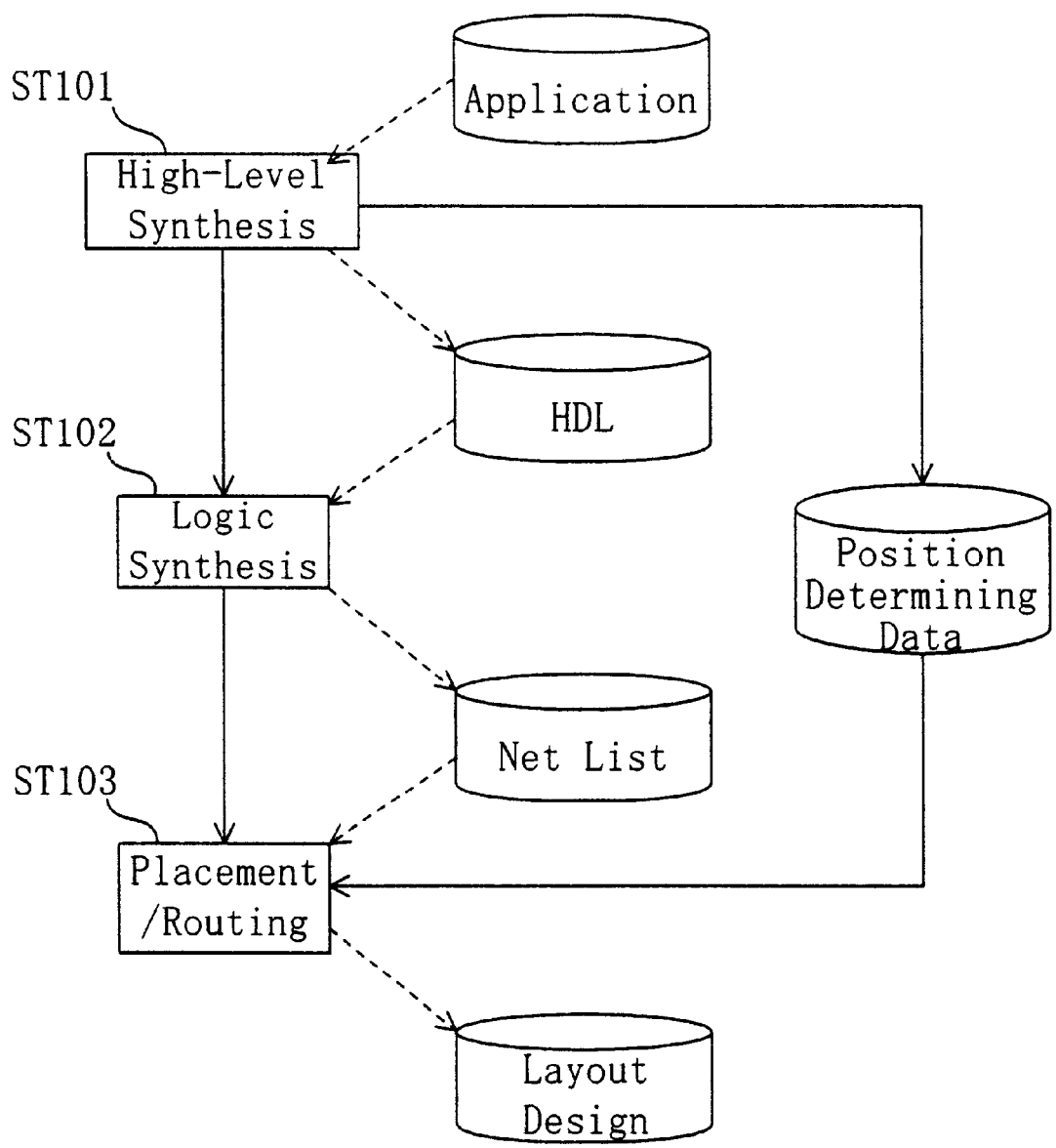
FIG. 17 is a flow chart showing the procedure of logic synthesis and placement and routing in a first specific example of a fifth embodiment of the present invention.

FIG. 17 is a flow chart illustrating the procedure of logic synthesis and placement and routing in the first specific example.

First, in Step ST101, an application program is inputted such that the high-level synthesis of any of the foregoing embodiments is performed. As a result, an HDL and position determining data as described above are obtained.

Next, in Step ST102, logic synthesis for transforming logic blocks in the HDL into a net list composed of combinations of macrocells is performed. The logic synthesis used and performed herein is such that the blocks and hierarchical structure resulting from block partitioning in the high-level synthesis are held and that data which is as recognizable in the net list as in the blocks is held.

Next, placement and routing (layout design) using the data given by the net list and the position determining data obtained in the high-level synthesis is performed. Specifically, placement and routing of operating devices and the like in the blocks, placement of each of the blocks, and routing between the individual blocks are performed. Finally, a layout of the semiconductor integrated circuit device is outputted.

According to the present specific example, logic synthesis and placement and routing can be performed automatically based on data on the positions of the blocks, modules, and the like that have been optimized in terms of reducing power consumption and delay in the high-level synthesis.

SPECIFIC EXAMPLE 2

Figure 18:
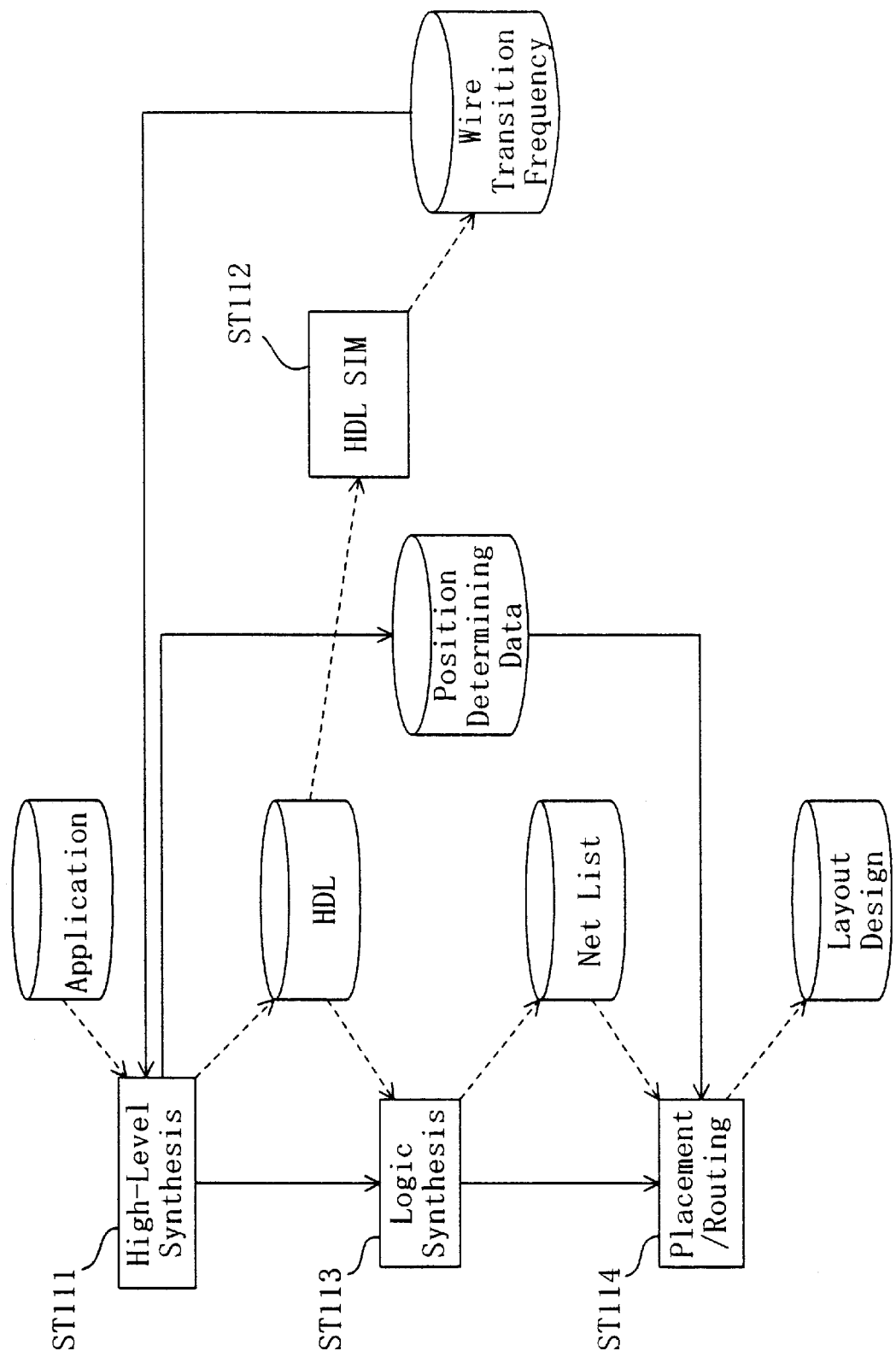
FIG. 18 is a flow chart showing the procedure of logic synthesis and placement and routing in a second specific example of the fifth embodiment.

FIG. 18 is a flow chart showing the procedure of logic synthesis and placement and routing in a second specific example.

First, in Step ST111, an application program is inputted such that the high-level synthesis of any of the foregoing embodiments is performed. As a result, an HDL and position determining data as described above are obtained.

Next, in Step ST112, the HDL is inputted and the simulation for estimating the transition frequency in each of the wires is executed. Specifically, the application is executed by using an HDL simulator such that the toggle frequency (transition frequency) in each of the signal lines (wires) is determined. The transition frequency is a more precise value than a transition frequency obtained from the application-level simulation in the high-level synthesis. Then, data on the wire transition frequencies is feedbacked to the high-level synthesis. The feedbacking is performed such that the second weights of signal lines between modules and the weights of signal lines between blocks are calculated again in Step ST41 of FIG. 11 in the second embodiment, that the second weights of signal lines between modules and the weights of signal lines between blocks are calculated again in Step ST61 of FIG. 15 in the third embodiment, and that the second weights of signal lines between modules and the weights of signal lines between blocks are calculated again in Step ST81 of FIG. 16 in the fourth embodiment.

Thereafter, the same logic synthesis and placement and routing as performed in the first specific example are performed in Steps ST113 and ST114, respectively.

Since the present specific example allows the data on the wire transition frequencies obtained from the RTL simulation which are more precise than the wire transition frequencies obtained from the application-level simulation to be reflected in block partitioning or building in high-level synthesis, design accuracy is further improved in the second and subsequent high-level syntheses. This enables block partitioning or building which is highly effective in reducing power consumption and delay.

SPECIFIC EXAMPLE 3

Figure 19:
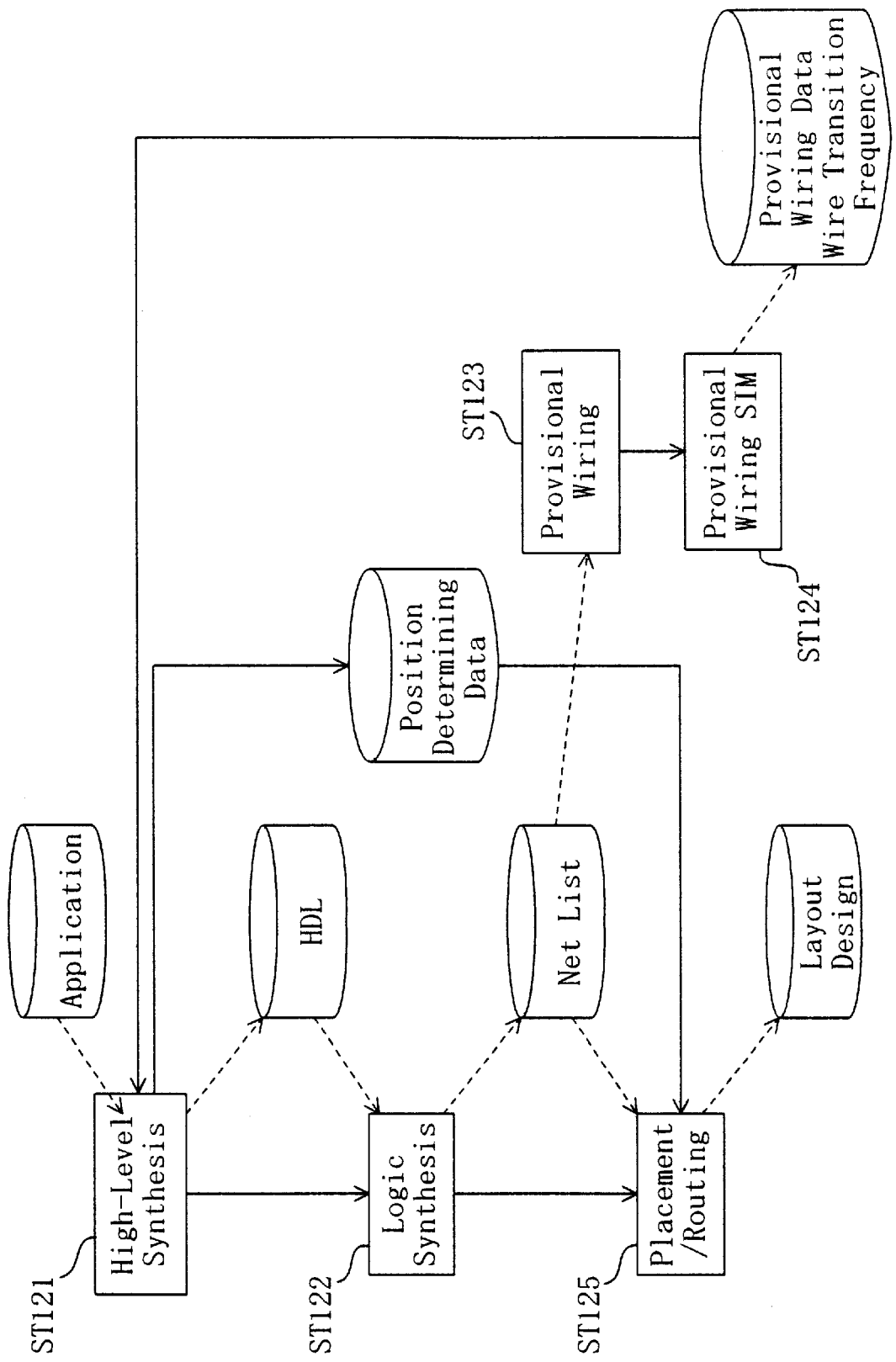
FIG. 19 is a flow chart showing the procedure of logic synthesis and placement and routing in a third specific example of the fifth embodiment.

FIG. 19 is a flow chart showing the procedure of logic synthesis and placement and routing in a third specific example.

First, in Step ST121, an application program is inputted such that the high-level synthesis of any of the foregoing embodiments is performed. As a result, an HDL and position determining data as described above are obtained.

Next, in Step S122, the same logic synthesis as performed in the first specific example is performed. Then, in Step ST123, provisional wiring is performed by using a net list obtained by the logic synthesis. Thereafter, in Step ST124, the application is executed on a logic simulator, whereby simulation with provisional wiring load is performed. By the simulation with provisional wiring load, not only the number of toggles in each of the wires but also the wire capacitance are measured. Then, wire transition frequencies and provision wiring data on the wire capacitances is outputted and feedbacked to the high-level synthesis. The feedbacking is performed such that the second weights of signal lines between modules and the weights of signal lines between blocks are calculated again in Step ST41 of FIG. 11 in the second embodiment, that the second weights of signal lines between modules and the weights of signal lines between blocks are calculated again in Step ST61 of FIG. 15 in the third embodiment, and that the second weights of signal lines between modules and the weights of signal lines between blocks are calculated again in Step ST81 of FIG. 16 in the fourth embodiment.

Since the present specific example allows the data on the wire transition frequencies obtained from the simulation with provisional wiring load which are more precise than the transition frequencies obtained from the application-level simulation to be reflected in block partitioning or building in high-level synthesis, design accuracy is further improved in the second and subsequent high-level syntheses. This enables block partitioning or building which is highly effective in reducing power consumption and delay.

SPECIFIC EXAMPLE 4

Figure 20:
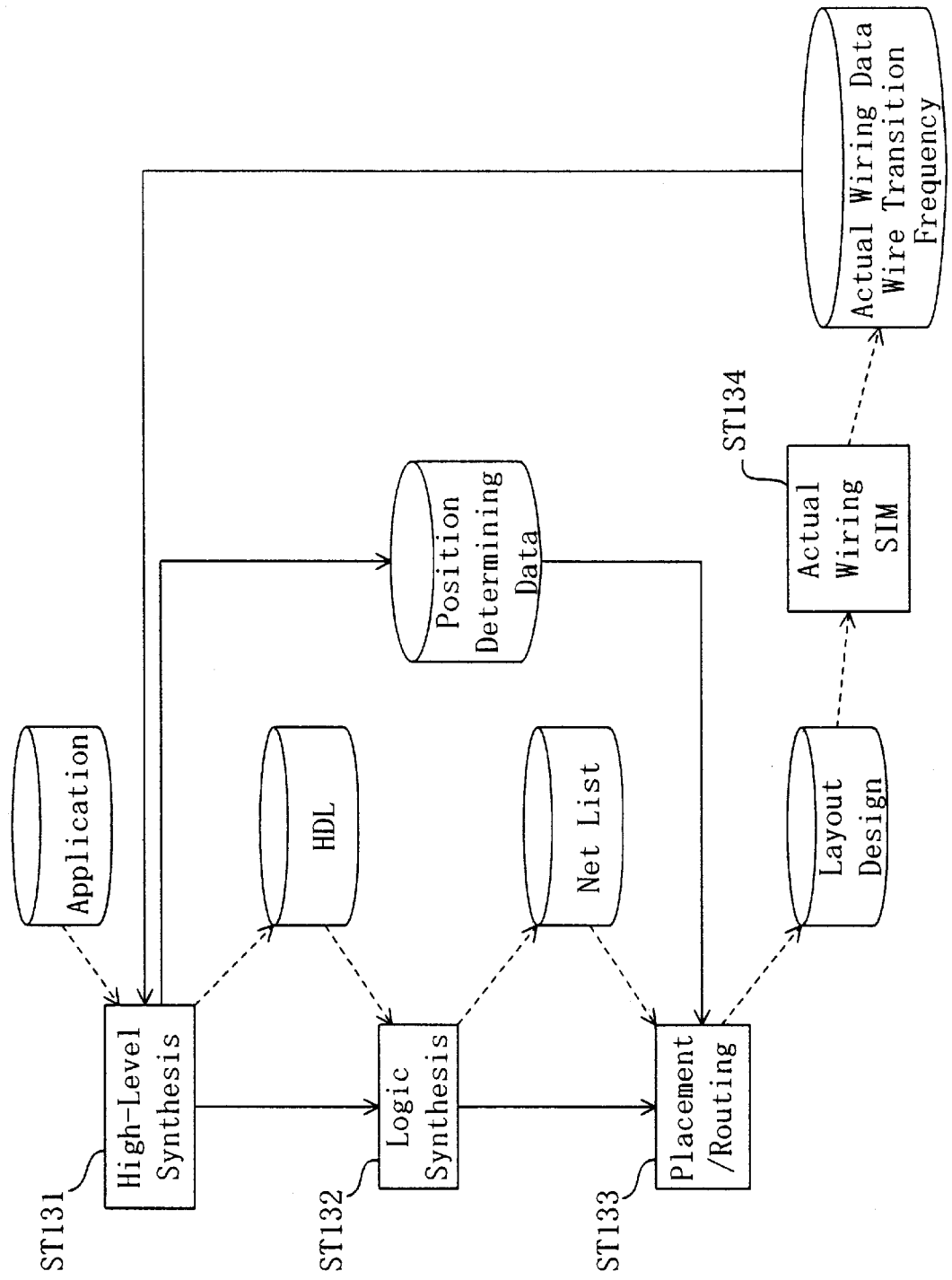
FIG. 20 is a flow chart showing the procedure of logic synthesis and placement and routing in a fourth specific example of the fifth embodiment.

FIG. 20 is a flow chart showing the procedure of logic synthesis and placement and routing in a fourth specific example.

First, in Step ST131, an application program is inputted such that the high-level synthesis of any of the foregoing embodiments is performed. As a result, an HDL and position determining data as described above are obtained.

Next, the same logic synthesis and placement and routing as performed in the first specific example are performed in Steps ST132 and ST133, respectively.

Next, in Step ST134, simulation with actual wire load is performed by executing the application on a logic simulator or SPICE by using a circuit in a layout obtained by placement and routing. By the simulation with actual wire load, not only the number of toggles in each of the wires but also the wire capacitance are measured. Then, wire transition frequencies and provisional wiring data on the wire capacitances as layout data given by placement and routing is outputted and feedbacked to the high-level synthesis. The feedbacking is performed such that the second weights of signal lines between modules and the weights of signal lines between blocks are calculated again in Step ST41 of FIG. 11 in the second embodiment, that the second weights of signal lines between modules and the weights of signal lines between blocks are calculated again in Step ST61 of FIG. 15 in the third embodiment, and that the second weights of signal lines between modules and the weights of signal lines between blocks are calculated again in Step ST81 of FIG. 16 in the fourth embodiment.

Since the present specific example allows the data on the wire capacitances obtained from the simulation with actual wire load which are more precise than the wire capacitances obtained from the simulation with provisional wiring load to be reflected in block partitioning or building in high-level synthesis, design accuracy is further improved in the second and subsequent high-level syntheses. This enables block partitioning or building which is highly effective in reducing power consumption and delay.

SPECIFIC EXAMPLE 5

Figure 21:
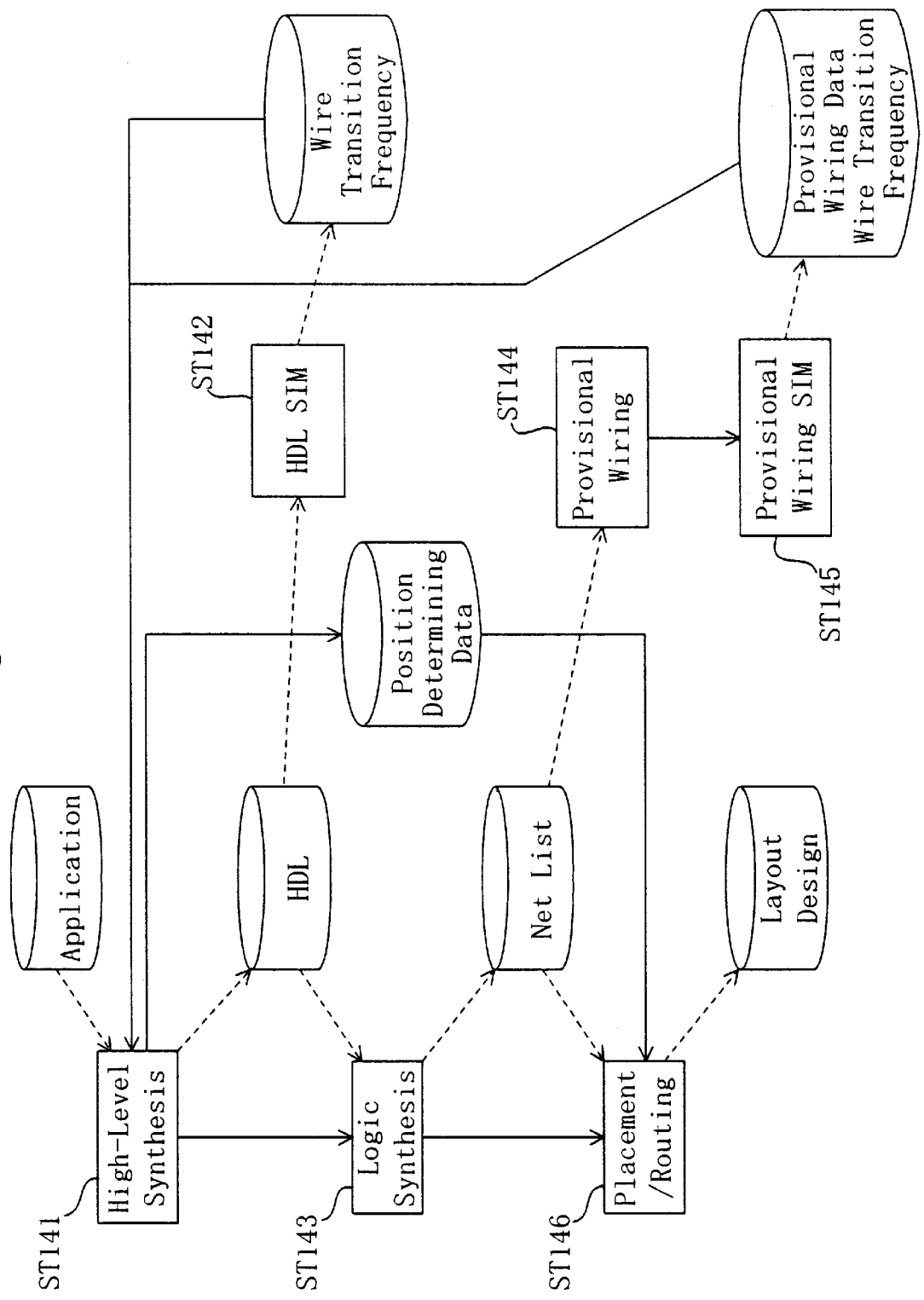
FIG. 21 is a flow chart showing the procedure of logic synthesis and placement and routing in a fifth specific example of the fifth embodiment.

FIG. 21 is a flow chart showing the procedure of logic synthesis and placement and routing in a fifth specific example.

First, in Step ST141, an application program is inputted such that the high-level synthesis of any of the foregoing embodiments is performed. As a result, an HDL and position determining data as described above are obtained.

Next, in Step ST142, the HDL is inputted and the simulation for estimating transition frequency in each of the wires is executed, similarly to the second specific example.

Specifically, the application is executed by using an HDL simulator such that the toggle frequency (transition frequency) in each of the signal lines (wires) is determined. Then, data on the wire transition frequencies is feedbacked to the step of high-level synthesis in each of the embodiments described above in the second specific example.

Next, in Step ST143, the same logic synthesis as performed in the first specific example is performed. Then, in Step ST144, provisional wiring is performed by using a net list obtained by the logic synthesis. Then, in Step ST145, simulation with provisional wiring load is performed by executing the application on a logic simulator, similarly to the third specific example. By the simulation with provisional wiring load, wire transition frequencies and provisional wiring data on the wire capacitances is outputted and feedbacked to the high-level synthesis. The feedbacking is performed in the same manner as in the third specific example.

In the present specific example, an output of the RTL simulation in which the simulation time is relatively short and the accuracy of output data is low is feedbacked to high-level synthesis, whereby the accuracy of block partition is increased such that the weight of signal lines between blocks in the high-level synthesis is smaller than the a first threshold value X. Then, an output of the simulation with provisional wiring load in which the simulation time is moderate and the accuracy of simulation is moderate is feedbacked to the high-level synthesis, whereby the accuracy of block partitioning is further increased such that the weight of signal lines between blocks in the high-level synthesis is smaller than a second threshold value Y.

By thus using the two types of feedbacked data for the high-level synthesis, the number of iterations in design can be reduced.

SPECIFIC EXAMPLE 6

Figure 22:
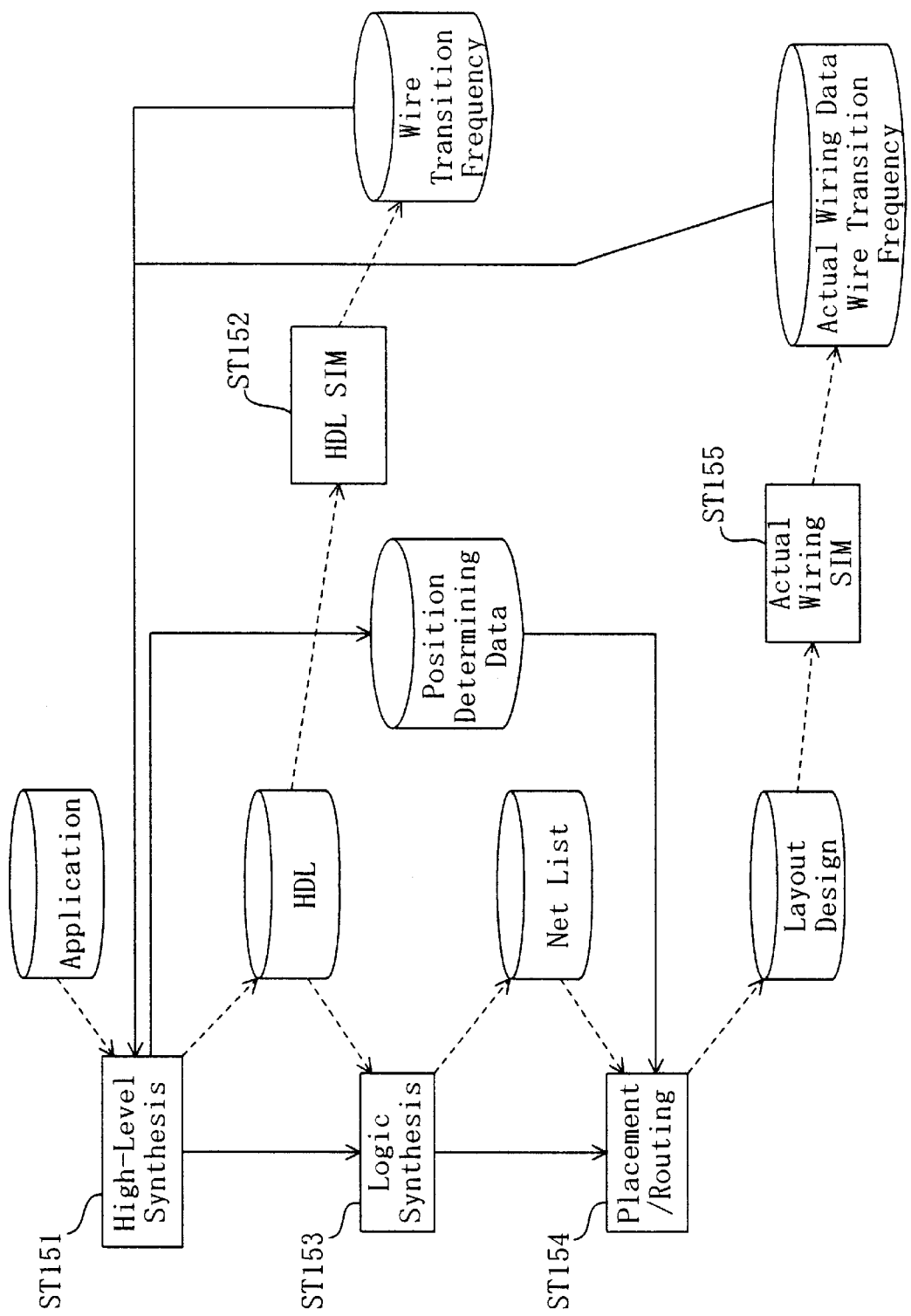
FIG. 22 is a flow chart showing the procedure of logic synthesis and placement and routing in a sixth specific example of the fifth embodiment.

FIG. 22 is a flow chart showing the procedure of logic synthesis and placement and routing in a sixth specific example.

First, in Step ST151, an application program is inputted such that the high-level synthesis of any of the foregoing embodiments is performed. As a result, an HDL and position determining data as described above are obtained.

Next, in Step ST152, the HDL is inputted and the transition frequency in each of the wires is simulated, similarly to the second specific example. Specifically, the application is executed by using an HDL simulator such that the toggle frequency (transition frequency) in each of the signal lines (wires) is determined. Then, data on the wire transition frequencies is feedbacked to the step of high-level synthesis in each of the embodiments described in the second specific example.

Next, the same logic synthesis and placement and routing as performed in the first specific example are performed in Steps ST153 and ST154, respectively. Then, in Step ST155, simulation with actual wire load is performed by executing the application on a logic simulator or SPICE by using a circuit on a layout obtained by placement and routing. By the simulation with actual wire load, not only the number of toggles in each of the wires but also the wire capacitance are measured. Then, wire transition frequencies and provisional wiring data on the wire capacitances as the layout data obtained by the placement and routing is outputted and feedbacked to the high-level synthesis. The feedbacking is performed in the same manner as in the fourth specific example.

In the present specific example, an output of the RTL simulation in which the simulation time is relatively short and the accuracy of output data is low is feedbacked to high-level synthesis, whereby the accuracy of block partitioning is increased such that the weight of signal lines between blocks in the high-level synthesis is smaller than a first threshold value X. Then, an output of the simulation with actual wire load in which the simulation time is relatively long and the accuracy of simulation is high is feedbacked to the high-level synthesis, whereby the accuracy of block partitioning is further increased such that the weight of signal lines between blocks in the high-level synthesis is smaller than a second threshold value Z.

By thus using the two types of feedbacked data for the high-level synthesis, the number of iterations in design can be reduced.

SPECIFIC EXAMPLE 7

Figure 23:
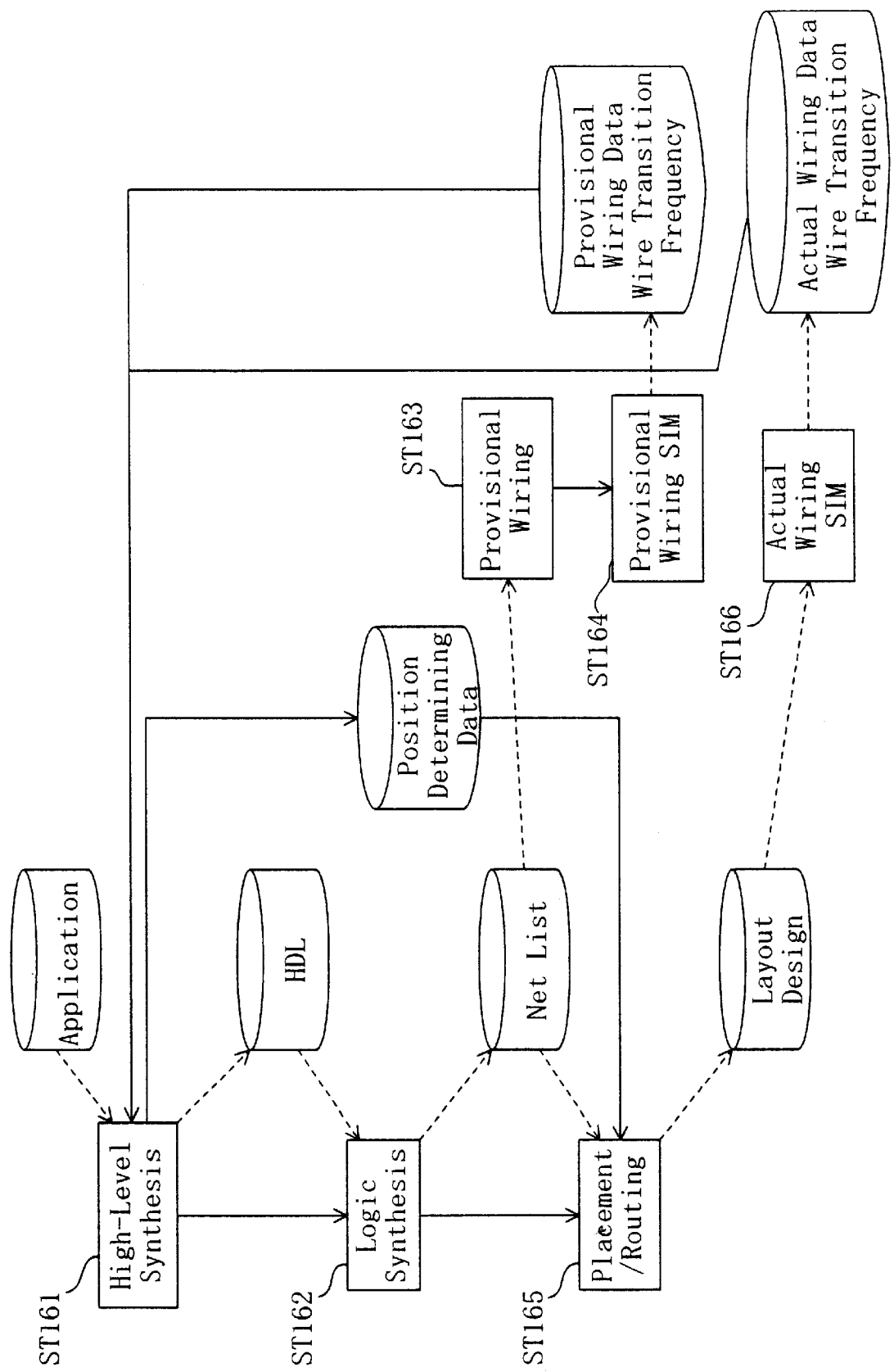
FIG. 23 is a flow chart showing the procedure of logic synthesis and placement and routing in a seventh specific example of the fifth embodiment.

FIG. 23 is a flow chart showing the procedure of logic synthesis and placement and routing in a seventh specific example.

First, in Step ST161, an application program is inputted such that the high-level synthesis of any of the foregoing embodiments is performed. As a result, an HDL and position determining data as described above are obtained.

Next, in Step ST162, the same logic synthesis as performed in the first specific example is performed. Then, in Step ST163, provisional wiring is performed by using a net list obtained by the logic synthesis. Thereafter, simulation with provisional wiring load is performed in Step ST164 by executing the application on a logic simulator, similarly to the third specific example. Wire transition frequencies and provisional wiring data on the wire capacitances obtained by the simulation with provisional wiring load is outputted and feedbacked to the high-level synthesis. The feedbacking is performed similarly to the third specific example.

Next, in Step ST165, the same placement and routing as performed in the first specific example is performed. Then, simulation with actual wire load is performed in Step ST166 by executing the application on a logic simulator or SPICE by using a circuit in a layout obtained by the placement and routing. By the simulation with actual wire load, not only the number of toggles in each of the wires but also the wire capacitance are measured. Then, wire transition frequencies and provisional wiring data on the wire capacitances as the layout data obtained by the placement and routing is outputted and feedbacked to the high-level synthesis. The feedbacking is performed in the same manner as in the fourth specific example.

In the present specific example, an output of the simulation with provisional wiring load in which the simulation time is moderate and the accuracy of output data is moderate is feedbacked to high-level synthesis, whereby the accuracy of block partitioning is increased such that the weight of signal lines between blocks in the high-level synthesis is smaller than the a first threshold value Y. Then, an output of the simulation with actual wire load in which the simulation time is relatively long and the accuracy of simulation is high is feedbacked to the high-level synthesis, whereby the accuracy of block partitioning is further increased such that the weight of signal lines between blocks in the high-level synthesis is smaller than a second threshold value Z.

By thus using the two types of feedbacked data for the high-level synthesis, the number of iterations in design can be reduced.

SPECIFIC EXAMPLE 8

Figure 24:
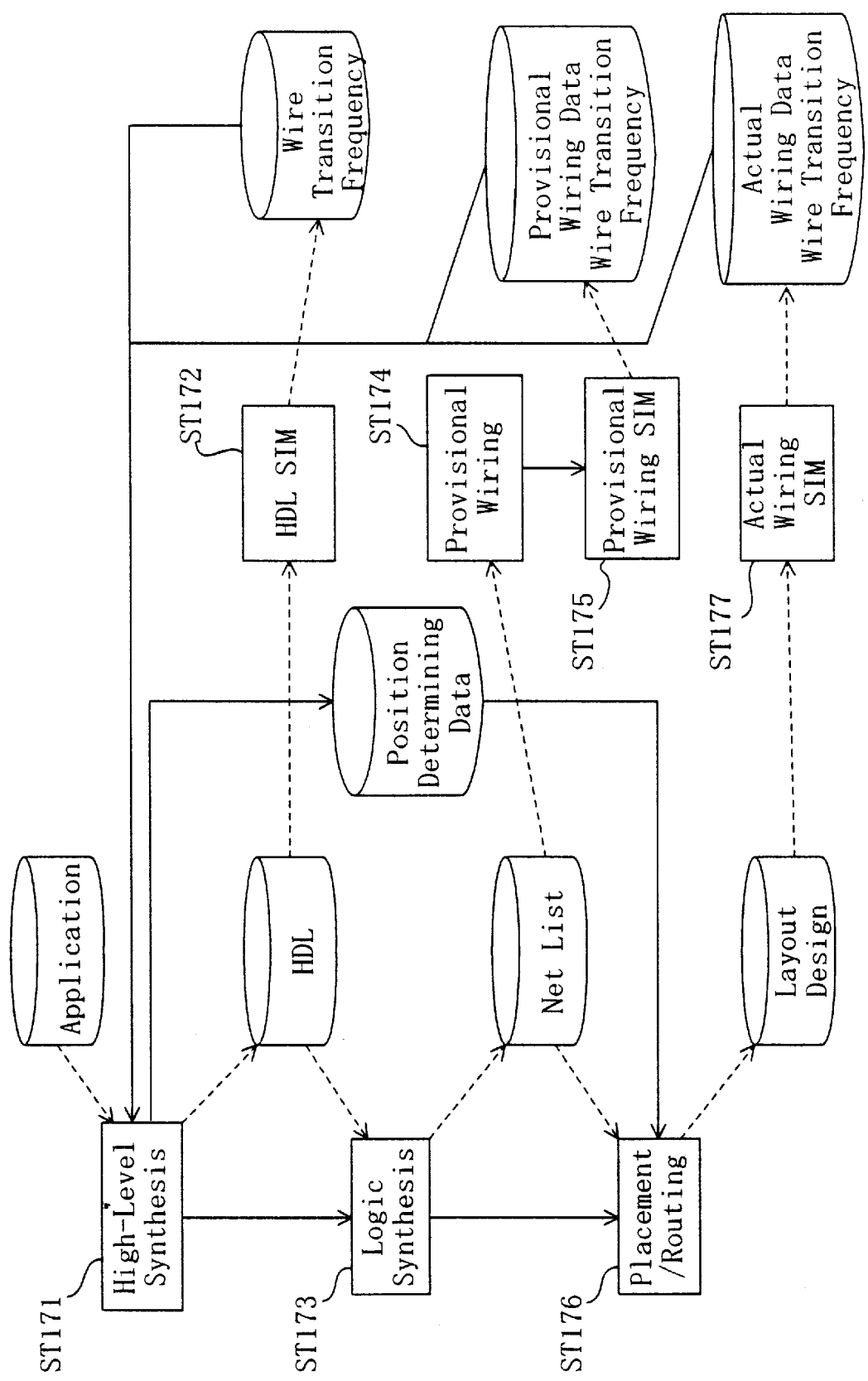
FIG. 24 is a flow chart showing the procedure of logic synthesis and placement and routing in an eighth specific example of the fifth embodiment.

FIG. 24 is a flow chart showing the procedure of logic synthesis and placement and routing in an eighth specific example.

First, in Step ST171, an application program is inputted such that the high-level synthesis of any of the foregoing embodiments is performed. As a result, an HDL and position determining data as described above are obtained.

Next, in Step ST172, the HDL is inputted and the transition frequency in each of the wires is simulated, similarly to the second specific example. Specifically, the application is executed by using an HDL simulator such that the toggle frequency (transition frequency) in each of the signal lines (wires) is determined. Then, data on the wire transition frequencies is feedbacked to the step of high-level synthesis in each of the embodiments described in the second specific example.

Next, in Step S173, the same logic synthesis as performed in the first specific example is performed. Next, in Step ST174, provisional wiring (pre-layout) is performed by using a net list obtained by the logic synthesis. Thereafter, simulation with provisional wiring load is performed in Step ST175 by executing the application on a logic simulator, similarly to the third specific example. Wire transition frequencies and provisional wiring data on the wire capacitances obtained by the simulation with provisional wiring load is outputted and feedbacked to the high-level synthesis. The feedbacking is performed in the same manner as in the third specific example.

Next, in Step ST176, the same placement and routing as performed in the first specific example is performed. Then, simulation with actual wire load is performed in Step ST177 by executing the application on a logic simulator or SPICE by using a circuit in a layout obtained by the placement and routing. By the simulation with actual wire load, not only the number of toggles in each of the wires but also the wire capacitance are measured. Then, wire transition frequencies and provisional wiring data on the wire capacitances as the layout data obtained by the placement and routing is outputted and feedbacked to the high-level synthesis. The feedbacking is performed in the same manner as in the fourth specific example.

In the present specific example, an output of the simulation with provisional wiring load in which the simulation time is moderate and the accuracy of output data is moderate is feedbacked to high-level synthesis, which achieves the effect of increasing the accuracy of block partitioning such that the weight of signal lines between blocks in the high-level synthesis is smaller than a second threshold value Y, in addition to the effects achieved by performing the foregoing RTL simulation. Then, an output of the simulation with actual wire load in which the simulation time is relatively long and the accuracy of simulation is high is feedbacked to the high-level synthesis, which achieves the effect of further increasing the accuracy of block partitioning such that the weight of signal lines between blocks in the high-level synthesis is smaller than a third threshold value Z.

By thus using the three types of feedbacked data for the high-level synthesis, the number of iterations in design can be reduced.

EMBODIMENT 6

In the present embodiment, a description will be given to a method of generating blocks (block partitioning or building) and a method for block repartitioning, which are not limited to the first to fourth embodiments and also applicable to general high-level synthesis. However, the method is also applicable to a processing method when blocks are generated (block partitioning or building) in the first to fourth embodiments or block repartitioning is performed upon receipt of a feedback indicating the result of judgment (NG) that has been performed in Steps ST15 and ST22 of FIG. 9, Step ST42 of FIG. 11, Step ST62 of FIG. 15, or Step ST82 of FIG. 16 (including the case where a feedback indicative of data obtained by simulation after the generation of the HDL is received in the fifth embodiment).

Block Partitioning and Repartitioning

Figure 25A:
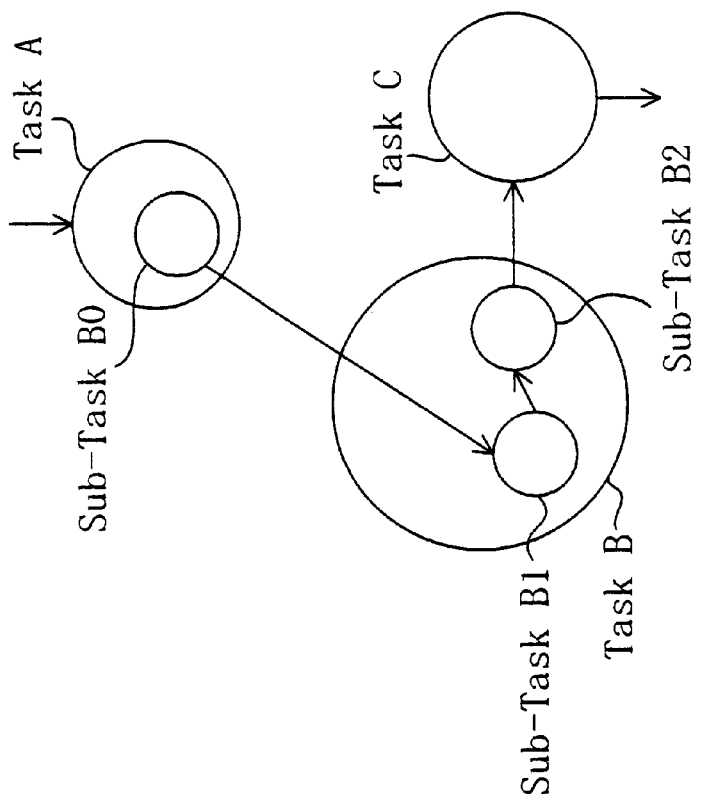
FIGS. 25(a) and 25(b) show an example of block partitioning and repartitioning performed in high-level synthesis in a sixth embodiment of the present invention.
Figure 25B:
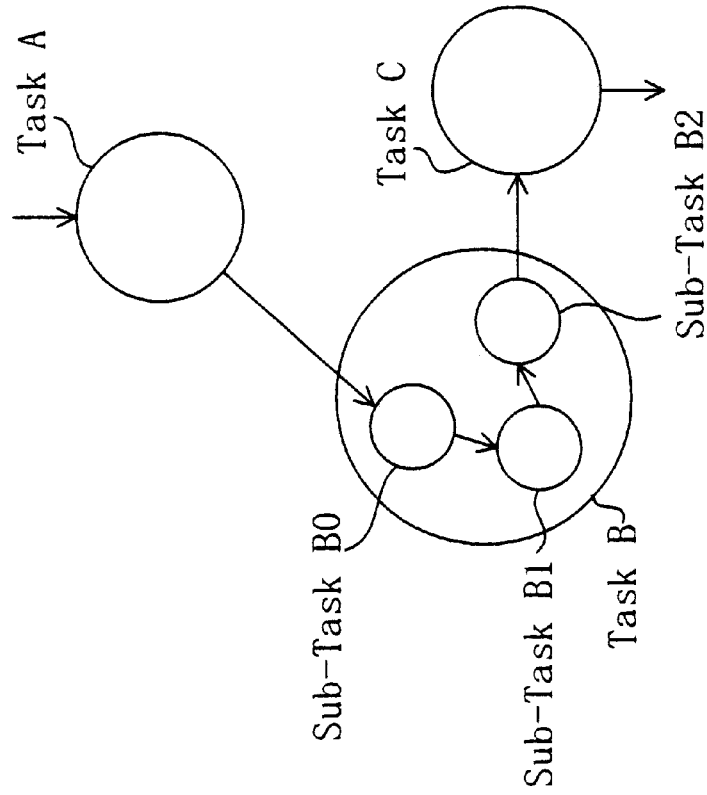

FIGS. 25(a) and 25(b) show an example of block partitioning and repartitioning performed in high-level synthesis according to the present embodiment.

In Step ST12 of the flow shown in FIG. 9, a first CDFG (task graph) defining a functionally significant process as one task based on the result of performing the lexical/syntax analysis of a behavioral description in an application program is generated in the initial process in which feedbacked data has not been received yet. The task is constituted by one or more sub-tasks. The sub-tasks correspond to the modules in the second, third, and fourth embodiments in each of which module generation is performed. For example, it is assumed that Sub-Task B0, Sub-Task B1, and Sub-Task B2 are contained in Task B. Although sub-tasks are also contained in Task A and Task C, they are not depicted in FIGS. 25(a) and 25(b). The arcs (arrows) shown in FIGS. 25(a) and 25(b) indicate data communication. Each of the tasks on the task graph corresponds to one HW block and each of the arcs extending from one block to another corresponds to the wire between blocks. The amount of data communication between the tasks (transition frequency in the wire between blocks) can be estimated based on feedbacked data such as an execution profile and an execution trace obtained from the result of simulation of the application program.

In a specific example, initial block partitioning having no feedbacked data is performed based on the generated task graph in Step ST12 of FIG. 9. At this stage, since the length of the wire corresponding to the arc and the wire transition frequency have not been determined yet, a certain value is given as the initial value. The initial value may be given uniformly or, if the task to be placed preferentially has been determined, the initial value is given such that the task is placed preferentially.

If a feedback from, e.g., Step ST15 of FIG. 9 is received thereafter, the amount of data communication between the tasks is determined rather specifically by the application-level simulation, so that block repartitioning is performed by using the amount of data communication. If a feedback is received from, e.g., Step ST22 of FIG. 9, Step ST42 of FIG. 11, Step ST62 of FIG. 15, or Step ST82 of FIG. 16, the distance between the blocks (the length of the arc shown in FIG. 25(a)) has been determined so that the weighting for the initial value is performed in consideration of the wire length and the wire transition frequency and the initial value is updated by using the wire length and the wire transition frequency. This determines the wire length corresponding to each of the arcs between the tasks after the placement of the tasks and the wire transition frequency. As a result, block repartitioning (or integration) can be performed in the subsequent step based on the values. If block repartitioning is performed after receiving a feedback after the RTL simulation in the fifth embodiment and then receiving a feedback from Step ST22 or the like, the transition frequency in the wire between blocks has been determined more precisely. If block repartitioning is performed after receiving a feedback after the simulation with provisional wiring load or the simulation with actual wire load in the fifth embodiment and then receiving a feedback from Step ST22 or the like, the wire transition frequency, the wire length, and the wire capacitance have been determined, so that weighting is performed in consideration of each of the values.

For example, it is assumed in FIG. 25(a) that the transition frequency in the arc from Task A to Task B proved to be high or the amount of data transfer therein proved to be large, while the amount of data transfer from Sub-Task B0 to Sub-Task B1 proved to be small. In this case, a large amount of array data (vector data) may be transferred from Task A and processed at Sub-Task B0 so that one value is given as the final result to Sub-Task B1. If such a relationship is established between the individual tasks, the amount of data transfer between the blocks of Task A and Task B or the wire transition frequency can be reduced by moving Sub-Task B0 in Task B into the block of Task A. By thus reducing the amount of data transfer or the wire transition frequency in the wire between blocks with a large length, power consumption and delay in the system can be reduced.

Weighting Calculation

① Wire Length

Figures 26A, 26B:
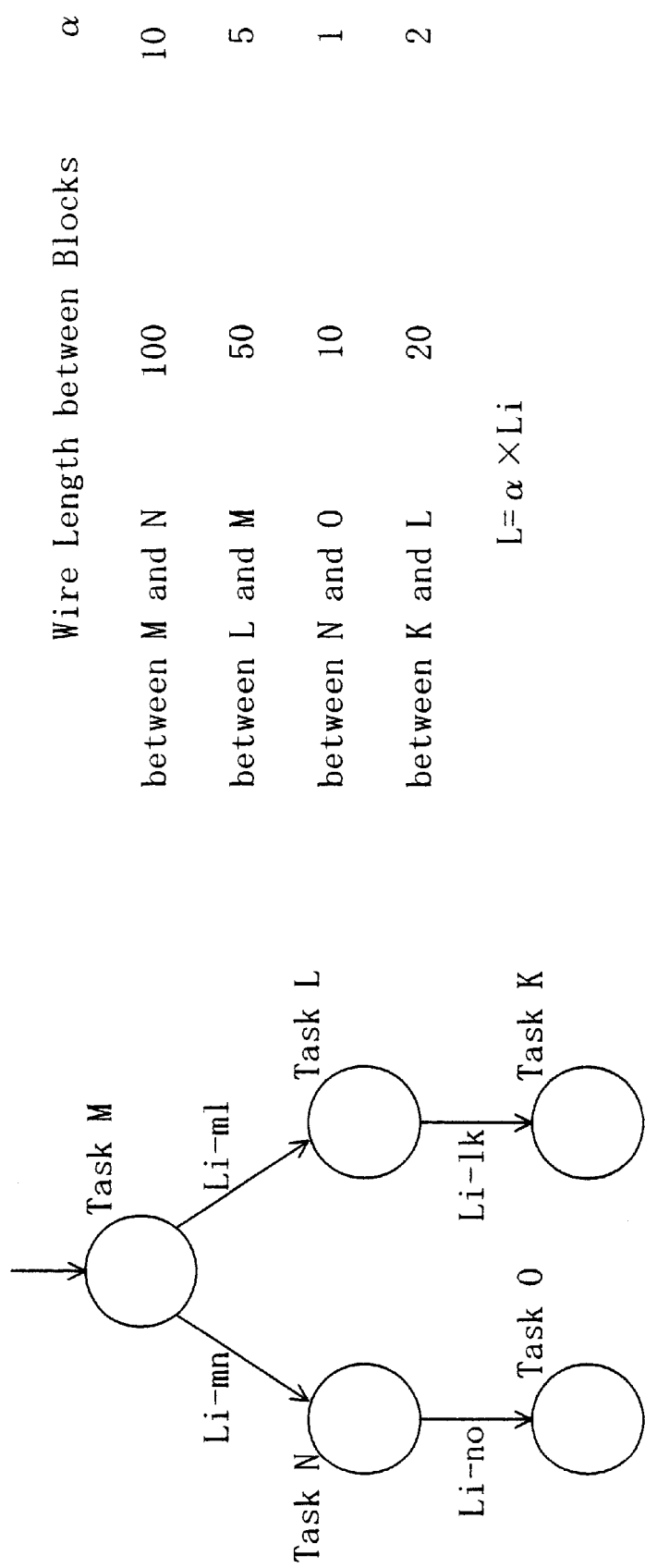
FIGS. 26(a) and 26(b) show a method of calculating weights of signal lines between blocks in the sixth embodiment.

FIGS. 26(a) and 26(b) illustrate a method of calculating each of the weights of signal lines between blocks. It is assumed that Tasks M, N, O, L, and K have been resulted from partitioning in the first process, as shown in FIG. 26(a). At this time, the wire length of the arc between the blocks (wire between blocks) has been set to an initial value Li. It is assumed that, for example, the wire lengths between Tasks M and N, Tasks N and O, between Tasks M and L, and between Tasks L and K have been set to respective initial values Li-mn, Li-no, Li-ml, and Li-lk. At this time, if an actual wire length, a provisional wire length, positional data, and the like are given as feedbacked data, new wiring data between blocks (values shown in FIG. 26(b)) is generated by multiplying the initial value Li by the ratios $\alpha$ ($\alpha$mn, $\alpha$no, $\alpha$ml, and $\alpha$lk) obtained by normalizing the ratios among the respective lengths of the wires between blocks and positional data, as shown in FIG. 26(b). As disclosed in "4.3 Capacitance Estimation" of "Neil H. E. Weste, Kamran Eshraghian, Principles of CMOS VLSI Design, A System Perspective, Second Edition ADDSION-WESLEY PUBLISHING COMPANY", the use of wire length data is effective in suppressing wire delay since wire delay is a function proportional to wire length. It will easily be appreciated that new wiring data between blocks can also be generated by replacing the initial value Li with the given feedbacked data. In the case where actual wire length is feedbacked, estimation accuracy is particularly improved by the use of an actual value. By comparing the wire length L between blocks with a maximum permissible value Lmax (threshold value), such a judgment as made in Step ST42 of FIG. 11, Step ST62 of FIG. 15, and Step ST82 of FIG. 16 can be made. Specifically, the whole process advances to the subsequent step if L$\leq$Lmax is satisfied. If L>Lmax is satisfied, block rebuilding or block repartitioning can be performed to satisfy L$\leq$Lmax.

② Wire Transition Frequency

In the first embodiment, new wire transition frequency data between blocks S (Smn, Sno, Sml, and Slk) is generated by multiplying, by the ratios $\beta$ ($\beta$mn, $\beta$no, $\beta$ml, and $\beta$lk) obtained by normalizing the ratios among the wire transition frequencies of the feedbacked signal line data between blocks, to the signal line data between blocks on each of the arcs between the blocks that has been given by the initial block partitioning (generation). This enables the calculation of an approximate value of power consumption in each of the wires between blocks.

As described in "4.7 Power Dissipation" of "Principles of CMOS VLSI Design, A System Perspective, Second Edition", the dynamic power consumption of a circuit is a function proportional to the transition frequency in the wire. If the transition rate in the wire is a, the wire capacitance is C, the power source voltage is V, and the frequency is f, the power consumption P is given by the following equation:

$$P = a \cdot C \cdot V^2 f.$$

Therefore, it will be understood that the use of the new wire transition frequency data is effective in suppressing the power consumption.

It is also possible to multiply the initial wire data between blocks (wire transition frequency) by the transition frequency, not by normalized ratios $\beta$, or replace the initial wire data between blocks with a more precise transition frequency obtained by simulation or the like. By comparing the total sum ($\Sigma$P) of power consumption in each of the wires between blocks with the maximum permissible value Pmax, such a judgment as made in Step ST15 of FIG. 9 can be made. Specifically, the whole process advances to the subsequent step if the total sum ($\Sigma$P) of power consumption in each of the wires between blocks does not exceed the maximum permissible value Pmax of power consumption ($\Sigma$P$\leq$Pmax). If the total sum ($\Sigma$P) of power consumption in each of the wires between blocks exceeds the maximum permissible value Pmax of power consumption ($\Sigma$P>Pmax), block repartitioning or rebuilding can be performed.

It is also possible to judge whether or not the weight of signal lines between blocks is proper in consideration only of the wire transition frequency in Step ST22 of FIG. 9, Step ST42 of FIG. 11, Step ST62 of FIG. 15, and Step ST82 of FIG. 16. After an approximate block-to-block distance is determined by provisional floor planning in the first embodiment, it becomes possible to make a judgment of whether or not weighting is proper by considering not only the wire transition frequency but also the wire length and the wire capacitance in Step ST22 of FIG. 9.

③ Wire Capacitance

New wire capacitance data between blocks T (Tmn, Tno, Tml, and Tlk) is generated by multiplying, by the ratios $\gamma$ ($\gamma$mn, $\gamma$no, $\gamma$ml, and $\gamma$lk) obtained by normalizing the ratios among the wire capacitances of the feedbacked signal line data between blocks, to the signal line data between blocks on each of the arcs between the blocks that has been given by the initial block partitioning (generation).

As is obvious from the equation:

$$P = a \cdot C \cdot V^2 \cdot f$$

the dynamic power consumption of the circuit is a function proportional to the wire capacitance. Therefore, it will be understood that the use of the wire capacitance data is effective in suppressing the power consumption. However, the wire capacitance can be calculated approximately from the wire length.

It is also possible to multiply the initial wire capacitance data between blocks by the wire capacitance, not by the normalized ratios $\gamma$, or replace the initial wire capacitance data between blocks with a more accurate wire capacitance obtained by simulation or the like. By comparing the total sum ($\Sigma$P) of power consumption in each of the wires between blocks with the maximum permissible value Pmax, such a judgment as made in Step ST22 of FIG. 9, Step ST42 of FIG. 11, Step ST62 of FIG. 15, or Step ST82 of FIG. 16 can be made. Specifically, the whole process advances to the subsequent step if the total sum ($\Sigma$P) of power consumption in each of the wires between blocks does not exceed the maximum permissible value Pmax($\Sigma$P$\leq$Pmax). If the total sum ($\Sigma$P) of power consumption in each of the wires between blocks exceeds the maximum permissible value Pmax ($\Sigma$>Pmax), block repartitioning or rebuilding can be performed.

④ Wire Length & Wire Transition Frequency, Wire Capacitance & Wire Transition Frequency It is possible to judge the weight of each of the wires between blocks by using some of the aforementioned parameters of wire length, wire transition frequency, and wire capacitance in combination, not by using them alone.

Specifically, it is possible to multiply the initial value of the weight of signal lines between blocks by the foregoing normalized ratios of each of the parameters or use the feedbacked data without alterations (replace the initial value with the feedbacked data). If the capacitance of a wire per unit length is C unit-length, the wire capacitance is expressed as a function proportional to the wire length. On the other hand, wire delay is a function of the resistance component (R) and capacitance (R) of the wire. In Step ST22 of FIG. 9, Step ST42 of FIG. 11, Step ST62 of FIG. 15, and Step ST82 of FIG. 16, a judgment of whether or not block partitioning is proper can be made based on the weight of the signal line between blocks incorporating each of the parameters. By thus using the parameters in combination, detailed wire data between blocks on both of the wire delay and power consumption can be obtained, so that the accuracy of the value of each of delay time and power consumption is increased.

EMBODIMENT 7

In the present embodiment, a description will be given to an example in which data obtained as a result of various simulations after the generation of the HDL in the fifth embodiment is returned to the step of transformation or binding, not to the step of calculating the weight of signal lines between blocks in the first to fourth embodiments.

A description will be given to a data feedback path. A signal line to which the wire transition frequency or provisional or actual wire load is feedbacked is a signal line connecting the modules or blocks. Examples of the signal line include a bus and a global wire (interruption or the like). Since signal lines in the modules have been optimized in the process of high-level synthesis, they are not the target of the foregoing feedbacking.

As examples of data to be feedbacked, there are the wire transition frequency data obtained as a result of RTL simulation, the provisional wire load obtained as a result of simulation with provisional wiring load, the actual wire load obtained as a result of simulation with actual wire load, and the like.

The wire transition frequency data includes the transition frequency (transition frequency and active frequency) on the wires between the modules obtained as a result of the logic simulation on the HDL level (RTL simulation).

The provisional wire load includes the length (wire capacitance) of each of the wires between modules obtained as a result of circuit simulation using the SPICE or the like performed after the provisional wiring and the transition frequency (or both of the wire transition frequency and the active frequency).

The actual wire load includes the length (wire capacitance) of each of the wires between modules obtained as a result of circuit simulation using the SPICE or the like performed after the actual wiring and the transition frequency (or both of the wire transition frequency and the active frequency).

In the foregoing specific examples, a description will be given to a method of feedbacking data obtained as a result of a simulation performed after the generation of the HDL to transformation or binding.

SPECIFIC EXAMPLE 1

Feedback to Transformation

It can be said that high-level synthesis is the process of generating an HDL on the register-transfer level (RTL) from a system represented in a hardware description language (HDL) on an operational level (a behavioral level), in a schematic representation such as a functional block diagram, or in a high-level language such as the C language. Thus, to obtain an RTL description with a low degree of abstract from the behavioral description with a high degree of abstract, the high-level synthesis converts the representation of the system to a level that can be implemented with hardware so long as the meaning of the behavioral description is not impaired. The process has elements common to a compiling process for transforming a high-level language, such as the C language, to an object code.

The process of transformation performed in each of the embodiments of the present invention corresponds to the conversion of an expression on the level of an intermediate language during a front-end process which is normally performed in a compiler for a high-level language. The front-end process is disclosed in a book ("Compilers I, II Principles, Techniques, and Tools" A. V. Aho, R. Sethi, J. D. Ulman, translated by Kenichi Harada, SAIENSU-SHA Co., Ltd. Publishers). The steps preceding transformation, i.e., the steps of lexical/syntax analysis and the like are analogous to steps performed in the front-end process of the compiler.

As described above, the transformation is performed by using various techniques used in the compiler, such as the application of the commutative law and the distributive law to a numerical expression, the in-line expansion of a function, the implementation of a single loop, the movement of a constant present in the loop to the outside thereof, and the like.

Figure 27A:
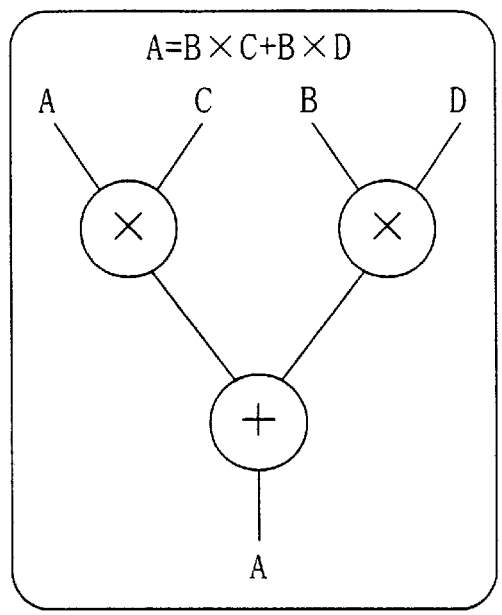
FIGS. 27(a) and 27(b) show an example of an approach to reducing power consumption by applying the distributive law to transformation in a seventh embodiment of the present invention.
Figure 27B:
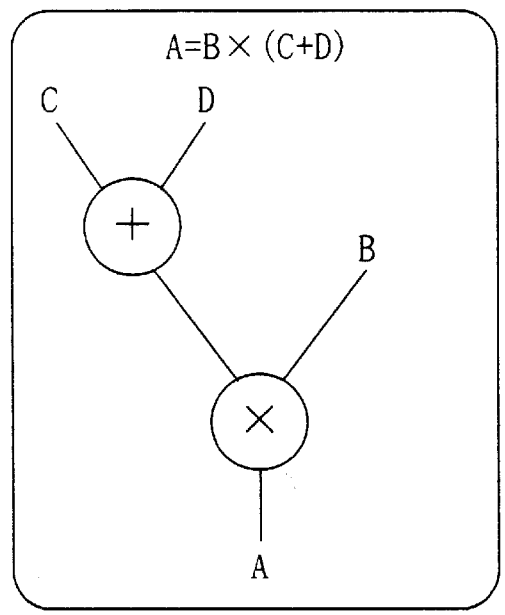

FIGS. 27(a) and 27(b) show an example in which power consumption is reduced by applying the distributive law to transformation. When a circuit block having the function of executing an operation of A=B×C+B×D is composed of two multipliers and one adder, as shown in FIG. 27(a), if the total sum of power consumption of the individual signal lines (i.e., the power consumption of the entire circuit) that has been feedbacked is larger than a threshold value, the circuit shown in FIG. 27(a) can be transformed into the circuit shown in FIG. 27(b) by applying the distributive law. Since the transformation reduces the number of activated signal lines (i.e., capacitance), the power consumption of the entire circuit is also reduced.

FIGS. 28(a) and 28(b) show an example in which power consumption is reduced by applying the in-line expansion to transformation. When function A is used in prog P and prog Q, as shown in FIG. 28(a), and prog P and prog Q are hardwared, there is a case where function A is hardwared as an operation module shared by prog P and prog Q, since prog P and prog Q have the common operational function of function A. By extracting function A as a common HW resource, however, the overall wiring length may be increased and power consumption in the signal line portions may be increased. In such a case, the shared operation module can be provided individually by performing the inline expansion, as shown in FIG. 28(b). Although each circuit block requires the operation module of function A as a result of the in-line expansion, power consumption can be suppressed by, e.g., applying Gated Clock, voltage control, or the like to each operation module. Although the circuit area increases, the in-line expansion is advantageous so long as the increased circuit area occupied in the entire chip is within a permissible range.

Thus, the in-line expansion has the advantage of reducing the power consumption of the entire circuit so long as the power consumption of circuit blocks each having an additional operation module can be suppressed provided that an increase in circuit scale does not present a problem.

SPECIFIC EXAMPLE 2

Feedback to Binding

Binding is the process of judging, if a plurality of nodes in a CDFG have common modules such as operating devices that have been allocated thereto, whether or not they should be resource-shared and generating a state machine for determining and controlling a final data path.

Whether or not rebinding should be performed depends on whether or not the total power consumption and maximum delay of the signal lines that have been determined based on the feedbacked data are within predetermined objective ranges. If the parameters are within the respective objective ranges, rebinding is not performed. If the parameters are not within the objective ranges, rebinding is performed.

FIGS. 29(a) and 29(b) illustrate the process of performing rebinding. The directionality (strategy) of optimization in performing rebinding is such that the number of resource sharings is minimized. The reason for this is that, since a module to be resource-shared is extracted during resource sharing, signal lines connecting a shared module (common HW resource) and peripheral modules connected thereto are elongated, as shown in FIG. 29(a), so that the total power consumption and delay of wires are increased. If the total power consumption and wire delays are large, nonsharing is preferred, as shown in FIG. 29(b). In this case also, however, it is expected that the circuit area is not increased by the non-sharing of the HW resource to such a degree as to present a problem.

What is claimed is:

1. A method of designing a semiconductor integrated circuit device, the method comprising the steps of:
    (a) inputting an application program including a behavioral description for designing the semiconductor integrated circuit device, partitioning, on a function-by-function basis, the application program including the behavioral description into blocks in which HW resources are to be placed, and generating an HW resource connection graph representing respective positions of the HW resources in each of the blocks and wires connecting the individual blocks;
    (b) inputting at least data on respective sizes of the HW resources from an HW library, provisionally placing the HW resources in the HW resource connection graph, and outputting provisional placement data;
    (c) calculating, as weights of signal lines between blocks, ratios of a parameter between the individual wires connecting the blocks which affects at least either one of power consumption and each wire delay;
    (d) judging whether or not each of the weights of signal lines between blocks is equal to or less than a threshold value; and
    (e) outputting, when each of the weights of signal lines between blocks becomes equal to or less than the threshold value, an RTL logic circuit described in an HDL, the generation of the blocks in the step (a) and the steps (b) to (d) being repeatedly performed till each of the weights of signal lines between blocks is judged equal to or less than the threshold value in the step (d).

2. The method of claim 1, wherein the step (a) includes the sub-steps of:
    (a1) partitioning the description in the application program into blocks representing tasks and generating a first data flow chart showing data flows between the individual tasks;
    (a2) simulating the application program;
    (a3) calculating, as first weights of signal lines between blocks, ratios between transition frequencies in the respective wires between blocks obtained in the sub-step (a2);
    (a4) judging whether or not each of the initial weights of signal lines between blocks is equal to or less than an initial threshold value;
    (a5) generating, when the initial weight of signal lines between blocks becomes equal to or less than the initial threshold value, a second data flow chart to allow the HW resources stored in the HW library to be placed in each of the blocks in the first data flow chart; and
    (a6) determining an execution timing for each of the blocks in the second data flow chart and placing the HW resources to generate the HW resource connection graph,
    block repartitioning in the sub-step (a1) and the sub-steps (a2) to (a4) being repeated till the initial weight of signal lines between blocks becomes equal to or less than the initial threshold value.

3. The method of claim 1, wherein the step (a) includes the sub-steps of:
    (a1) partitioning the description in the application program into modules each composed of a plurality of operational functions and generating a first data flow chart showing data flows between the individual modules;
    (a2) simulating the application program;
    (a3) calculating, as first weights of signal lines between modules, ratios of a parameter between respective wires connecting the modules obtained in the sub-step (a2) which affects at least either one of power consumption and each wire delay;
    (a4) grouping the plurality of modules into the plurality of blocks each composed of the plurality of modules;
    (a5) generating a second data flow chart which allows the HW resources stored in the HW library to be placed in each of the modules in the first data flow chart; and
    (a6) determining an execution timing for each of the modules in the second data flow chart and allocating the HW resources to generate the HW resource connection graph and
    the step (c) includes calculating second weights of signal lines between modules from the provisional placement data and the first signal weights between modules and designating, as the weights of signal lines between blocks, the respective second weights of signal lines between modules of the wires connecting the blocks.

4. The method of claim 1, wherein the step (a) includes the sub-steps of:
    (a1) analyzing the description in the application program to generate a first data flow chart showing data flows between operational functions each implementing a behavior to allow the HW resources stored in the HW library to be placed;

(a2) generating, from the plurality of operational functions, modules each composed of the plurality of operational functions and generating, from the first data flow chart, a second data flow chart showing data flows between the individual modules;

(a3) simulating the application program;

(a4) calculating, as first weights of signal lines between modules, ratios of a parameter between respective wires connecting the modules which affects at least either one of power consumption and each wire delay;

(a5) grouping the plurality of modules into the plurality of blocks composed of the plurality of modules; and (a6) determining an execution timing for each of the modules in the second data flow chart and allocating the HW resources to generate the HW resource connection graph and the step (c) includes calculating second weights of signal lines between modules from the provisional data and the first weights of signal lines between modules and designating, as the weights of signal lines between blocks, the respective second weights of signal lines between modules of the wires connecting the blocks.

5. The method of claim 1, wherein the step (a) includes the sub-steps of:

(a1) analyzing the behavioral description in the application program to generate a first data flow chart showing data flows between operational functions to allow the HW resources stored in the HW library to be placed;

(a2) determining an execution timing for each of the operational functions in the first data flow chart and allocating the HW resources to generate the HW resource connection graph;

(a3) generating, from the plurality of operational functions, modules each composed of the plurality of operational functions;

(a4) simulating the application program;

(a5) calculating, as first weights of signal lines between modules, ratios of a parameter between respective wires connecting the modules obtained in the sub-step (a3) which affects at least either one of power consumption and each wire delay; and (a6) grouping the plurality of modules into the plurality of blocks each composed of the plurality of modules and the step (c) includes calculating second weights of signal lines between modules from the provisional placement data and the first weights of signal lines between modules and designating, as the weights of signal lines between blocks, the second weights of signal lines between modules of the wires connecting the blocks.

6. The method of claim 1, further comprising, after the step (e), the steps of:

(f) performing logic synthesis using design data described in the HDL to represent data on the blocks and a wiring structure between the blocks in a net list; and (g) performing placement and routing using the net list and outputting layout data, wherein the placement and routing is performed in the step (g) by using, as position determining data, the provisional placement data obtained in the step (b) and data on the blocks obtained in the step (c).

7. The method of claim 3, further comprising, after the step (e), the steps of:

(f) performing logic synthesis using design data described in the HDL to represent data on the modules and a wiring structure between the modules in a net list; and (g) performing placement and routing using the net list and outputting layout data, wherein placement and routing is performed in the step (g) by using the provisional placement data obtained in the step (b) and data on the blocks obtained in the step (c) and after the step (e) and before the step (f), RTL simulation is performed and data resulting from the RTL simulation is feedbacked to the step (c).

8. The method of claim 3, further comprising, after the step (e), the steps of:

(f) performing logic synthesis using design data described in the HDL to represent data on the modules and a wiring structure between the modules in a net list; and (g) performing placement and routing using the net list and outputting layout data, wherein placement and routing is performed in the step (g) by using the provisional placement data obtained in the step (b) and data on the blocks obtained in the step (c) and after the step (f) and before the step (g), provisional wiring using the net list and simulation with provisional wiring load using a result of the provisional wiring are performed and data obtained as a result of the simulation with provisional wiring load is feedbacked to the step (c).

9. The method of claim 3, further comprising, after the step (e), the steps of:

(f) performing logic synthesis using design data described in the HDL to represent data on the modules and a wiring structure between the modules in a net list; and (g) performing placement and routing using the net list and outputting layout data, wherein placement and routing is performed in the step (g) by using the provisional placement data obtained in the step (b) and data on the blocks obtained in the step (c) and after the step (g), simulation with actual wire load using the layout data is performed and data obtained as a result of the simulation with actual wire load is feedbacked to the step (c).

10. The method of claim 7, wherein, after the step (f) and before the step (g), provisional wiring using the net list and simulation with provisional wiring load using a result of the provisional wiring are performed and data obtained as a result of the simulation with provisional wiring load is feedbacked to the step (c).

11. The method of claim 7, wherein, after the step (g), simulation with actual wire load using the layout data is performed and data obtained as a result of the simulation with actual wire load is feedbacked to the step (c).

12. The method of claim 8, wherein, after the step (g), simulation with actual wire load using the layout data is performed and data obtained as a result of the simulation with actual wire load is feedbacked to the step (c).

13. The method of claim 10, wherein, after the step (g), simulation with actual wire load using the layout data is performed and data obtained as a result of the simulation with actual wire load is feedbacked to the step (c).

14. The method of claim 1, wherein the step (c) includes designating, as the weights of signal lines between blocks, respective contribution rates of lengths of the wires between blocks.

15. The method of claim 1, wherein the step (c) includes designating, as the weights of signal lines between blocks, respective contribution rates of capacitances of the wires between blocks.

16. The method of claim 1, wherein the step (c) includes designating, as the weights of signal lines between blocks, respective contribution rates of transition frequencies of the wires between blocks.

17. The method of claim 1, wherein the step (c) includes designating, as the weights of signal lines between blocks, respective contribution rates of lengths and transition frequencies of the wires between blocks.

18. The method of claim 1, wherein the step (c) includes designating, as the weights of signal lines between blocks, respective contribution rates of capacitances and transition frequencies of the wires between blocks.

19. The method of claim 4, further comprising, after the step (e), the steps of:

(f) performing logic synthesis using design data described in the HDL to represent data on the modules and a wiring structure between the modules in a net list; and (g) performing placement and routing using the net list and outputting layout data, wherein the placement and routing is performed in the step (g) by using, as position determining data, the provisional placement data obtained in the step (b) and data on the blocks obtained in the step (c) and after the step (e) and before the step (f), RTL simulation is performed and data obtained as a result of the RTL simulation is feedbacked to the sub-step (a1).

20. The method of claim 4, further comprising, after the step (e), the steps of:

(f) performing logic synthesis using design data described in the HDL to represent data on the modules and a wiring structure between the modules in a net list; and (g) performing placement and routing using the net list and outputting layout data, wherein the placement and routing is performed in the step (g) by using, as position determining data, the provisional placement data obtained in the step (b) and data on the blocks obtained in the step (c) and after the step (f) and before the step (g), provisional wiring using the net list and simulation with provisional wiring load using a result of the provisional wiring are performed and data obtained as a result of the simulation with provisional wiring load is feedbacked to the sub-step (a1).

21. The method of claim 4, further comprising, after the step (e), the steps of:

(f) performing logic synthesis using design data described in the HDL to represent data on the modules and a wiring structure between the modules in a net list; and (g) performing placement and routing using the net list and outputting layout data, wherein the placement and routing is performed in the step (g) by using, as position determining data, the provisional placement data obtained in the step (b) and data on the blocks obtained in the step (c) and after the step (g), simulation with actual wire load using the layout data is performed and data obtained as a result of the simulation with actual wire load is feedbacked to the sub-step (a1).

22. The method of claim 5, further comprising, after the step (e), the steps of:

(f) performing logic synthesis using design data described in the HDL to represent data on the modules and a wiring structure between the modules in a net list; and (g) performing placement and routing using the net list and outputting layout data, wherein the placement and routing is performed in the step (g) by using, as position determining data, the provisional placement data obtained in the step (b) and data on the blocks obtained in the step (c) and after the step (e) and before the step (f), RTL simulation is performed and data obtained as a result of the RTL simulation is feedbacked to the sub-step (a2).

23. The method of claim 4, further comprising, after the step (e), the steps of:

(f) performing logic synthesis using design data described in the HDL to represent data on the modules and a wiring structure between the modules in a net list; and (g) performing placement and routing using the net list and outputting layout data, wherein the placement and routing is performed in the step (g) by using, as position determining data, the provisional placement data obtained in the step (b) and data on the blocks obtained in the step (c) and after the step (f) and before the step (g), provisional wiring using the net list and simulation with provisional wiring load using a result of the provisional wiring are performed and data obtained as a result of the simulation with provisional wiring load is feedbacked to the sub-step (a2).

24. The method of claim 4, further comprising, after the step (e), the steps of:

(f) performing logic synthesis using design data described in the HDL to represent data on the modules and a wiring structure between the modules in a net list; and (g) performing placement and routing using the net list and outputting layout data, wherein the placement and routing is performed in the step (g) by using, as position determining data, the provisional placement data obtained in the step (b) and data on the blocks obtained in the step (c) and after the step (g), simulation with actual wire load using the layout data is performed and data obtained as a result of the simulation with actual wire load is feedbacked to the sub-step (a2).

* * * * *